United States Patent
Shibata et al.

(10) Patent No.: US 11,081,437 B2
(45) Date of Patent: Aug. 3, 2021

(54) IMAGING ELEMENT MOUNTING BOARD, PRODUCING METHOD OF IMAGING ELEMENT MOUNTING BOARD, AND MOUNTING BOARD ASSEMBLY

(71) Applicant: NITTO DENKO CORPORATION, Osaka (JP)

(72) Inventors: Shusaku Shibata, Osaka (JP); Yoshihiro Kawamura, Osaka (JP); Hayato Takakura, Osaka (JP); Takahiro Takano, Osaka (JP); Shuichi Wakaki, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 16/499,987

(22) PCT Filed: Apr. 4, 2018

(86) PCT No.: PCT/JP2018/014380
§ 371 (c)(1),
(2) Date: Oct. 1, 2019

(87) PCT Pub. No.: WO2018/190215
PCT Pub. Date: Oct. 18, 2018

(65) Prior Publication Data
US 2020/0105656 A1    Apr. 2, 2020

(30) Foreign Application Priority Data

Apr. 10, 2017 (JP) .............................. JP2017-077542
Oct. 18, 2017 (JP) .............................. JP2017-201977
Apr. 3, 2018 (JP) .............................. JP2018-071825

(51) Int. Cl.
*H01L 23/498* (2006.01)
*H01L 23/552* (2006.01)
(Continued)

(52) U.S. Cl.
CPC ...... *H01L 23/49838* (2013.01); *H01L 21/481* (2013.01); *H01L 21/4857* (2013.01);
(Continued)

(58) Field of Classification Search
CPC ...... H05K 1/02; H05K 1/0218; H05K 1/0283; H05K 1/09; H05K 1/11; H05K 1/118;
(Continued)

(56) References Cited

U.S. PATENT DOCUMENTS 5,294,755 A     3/1994  Kawakami et al.
2001/0055073 A1  12/2001  Shinomiya
(Continued)

FOREIGN PATENT DOCUMENTS

JP     02-241077 A    9/1990
JP     07-179604 A    7/1995
(Continued)

OTHER PUBLICATIONS

International Search Report Issued in PCT/JP2018/014380 dated Jun. 19, 2018.
(Continued)

*Primary Examiner* — Roshn K Varghese
(74) *Attorney, Agent, or Firm* — Edwards Neils LLC; Jean C. Edwards, Esq.

(57) ABSTRACT

An imaging element mounting board for mounting an imaging element has a wire region including a first insulating layer, a metal wire disposed at one side in a thickness direction of the first insulating layer, and a second insulating layer disposed at one side in the thickness direction of the metal wire. An equivalent elastic modulus of the wire region is 5 GPa or more and 55 GPa or less.

14 Claims, 11 Drawing Sheets

(51) Int. Cl.
*H05K 1/09* (2006.01)
*H04N 5/225* (2006.01)
*H01L 21/48* (2006.01)

(52) U.S. Cl.
CPC .... *H01L 23/4985* (2013.01); *H01L 23/49822* (2013.01); *H01L 23/552* (2013.01); *H04N 5/2252* (2013.01); *H04N 5/2253* (2013.01); *H05K 1/09* (2013.01)

(58) Field of Classification Search
CPC .... H05K 2201/0104; H05K 2201/0154; H01L 23/49838; H01L 23/4985; H01L 23/552; H01L 23/49822; H01L 23/562; H01L 21/6835; H01L 2221/68345; H01L 27/14; H04N 5/2252; H04N 5/2253
See application file for complete search history.

(56) References Cited

U.S. PATENT DOCUMENTS

| | | | |
|---|---|---|---|
| 2002/0158324 A1* | 10/2002 | Hamaguchi | H05K 3/3436 257/686 |
| 2002/0189854 A1* | 12/2002 | Crumly | H05K 1/0281 174/254 |
| 2007/0128952 A1* | 6/2007 | Kataoka | H05K 1/118 439/719 |
| 2007/0237949 A1* | 10/2007 | Nonaka | C09J 7/385 428/343 |
| 2008/0078573 A1* | 4/2008 | Hu | H05K 1/0271 174/262 |
| 2009/0071693 A1* | 3/2009 | Tokuhiro | H05K 3/287 174/250 |
| 2009/0244859 A1* | 10/2009 | Muro | H05K 1/0218 361/749 |
| 2010/0304298 A1 | 12/2010 | Hirashima et al. | |
| 2011/0073358 A1* | 3/2011 | Hayashi | H05K 3/4655 174/258 |
| 2013/0118788 A1 | 5/2013 | Hishiki et al. | |
| 2015/0305136 A1* | 10/2015 | Tachikawa | H05K 1/02 174/254 |
| 2015/0358517 A1 | 12/2015 | Ikemoto et al. | |
| 2018/0324943 A1* | 11/2018 | Fukuda | H05K 1/0281 |

FOREIGN PATENT DOCUMENTS

| | | |
|---|---|---|
| JP | 2002-077683 A | 3/2002 |
| JP | 2005-210628 A | 8/2005 |
| JP | 2010-276775 A | 12/2010 |
| JP | 2013-100441 A | 5/2013 |
| JP | 2014-175423 A | 9/2014 |
| JP | 2015-038908 A | 2/2015 |
| WO | 2014/174943 A1 | 10/2014 |

OTHER PUBLICATIONS

Written Opinion Issued in PCT/JP2018/014380 dated Jun. 19, 2018.
International Preliminary Report on Patentability issued by WIPO dated Oct. 15, 2019, in connection with International Patent Application No. PCT/JP2018/014380.

* cited by examiner

FIG.1
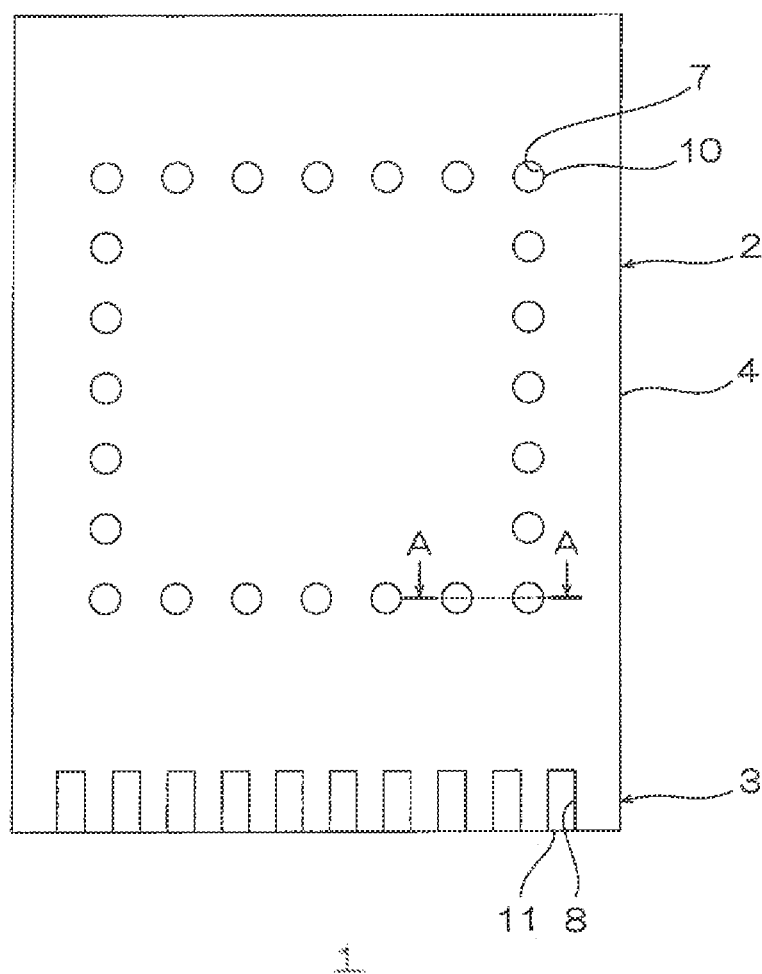
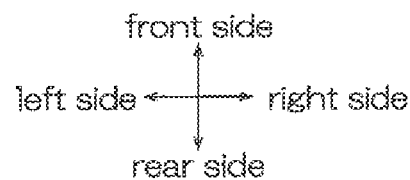

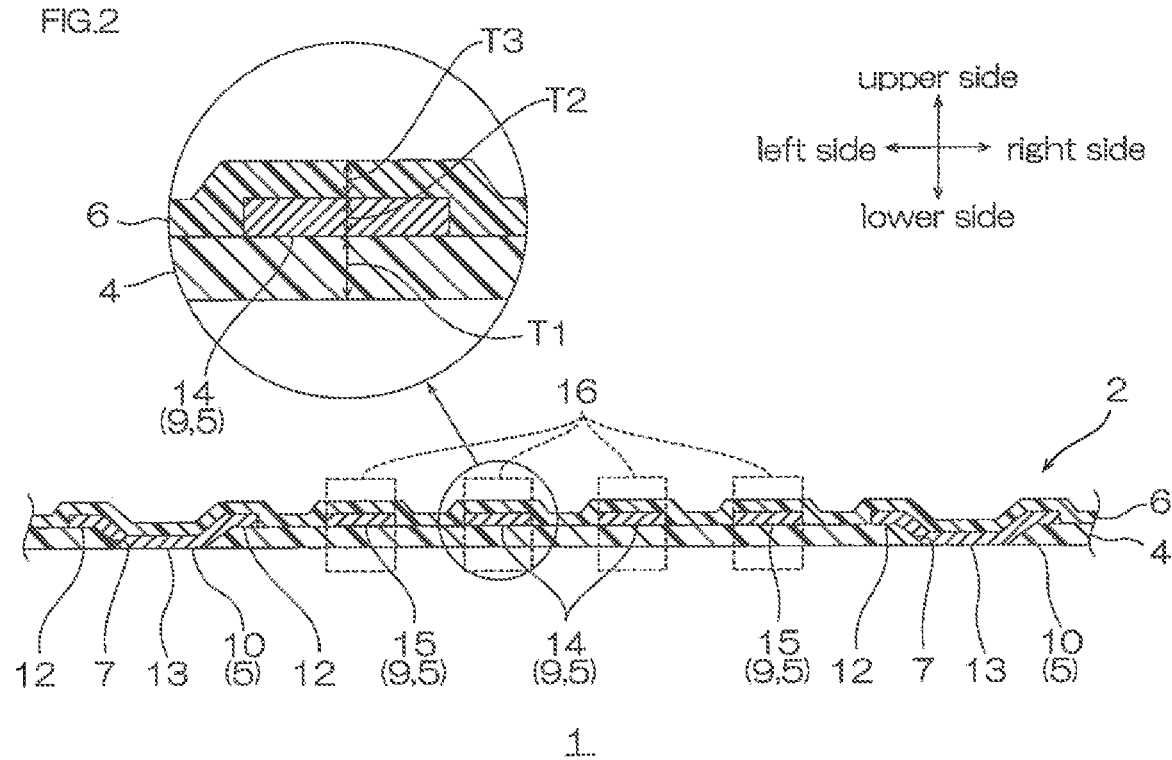

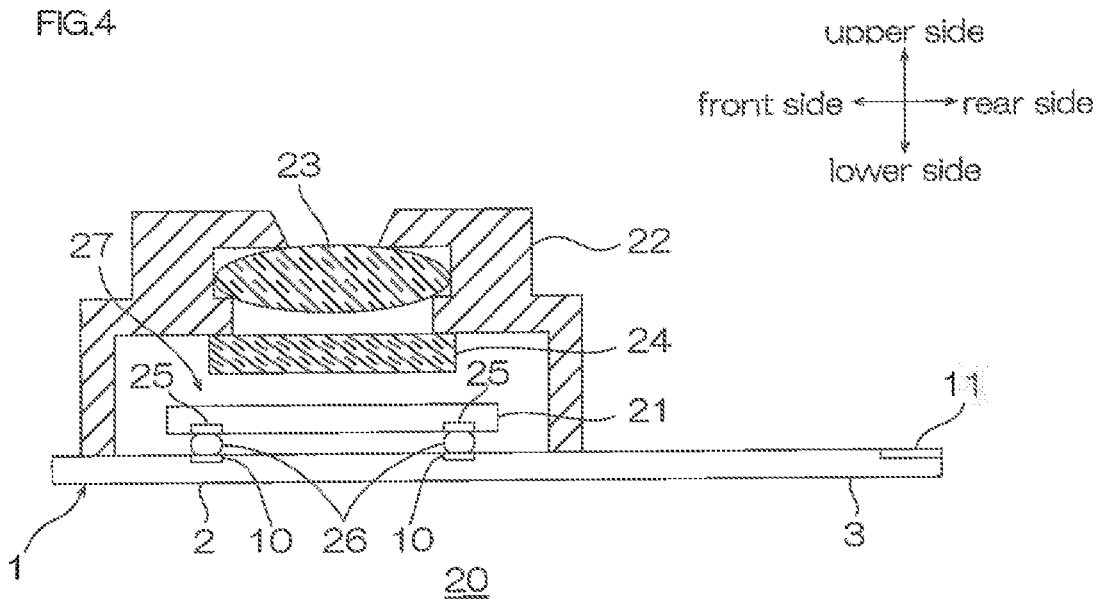

FIG.5
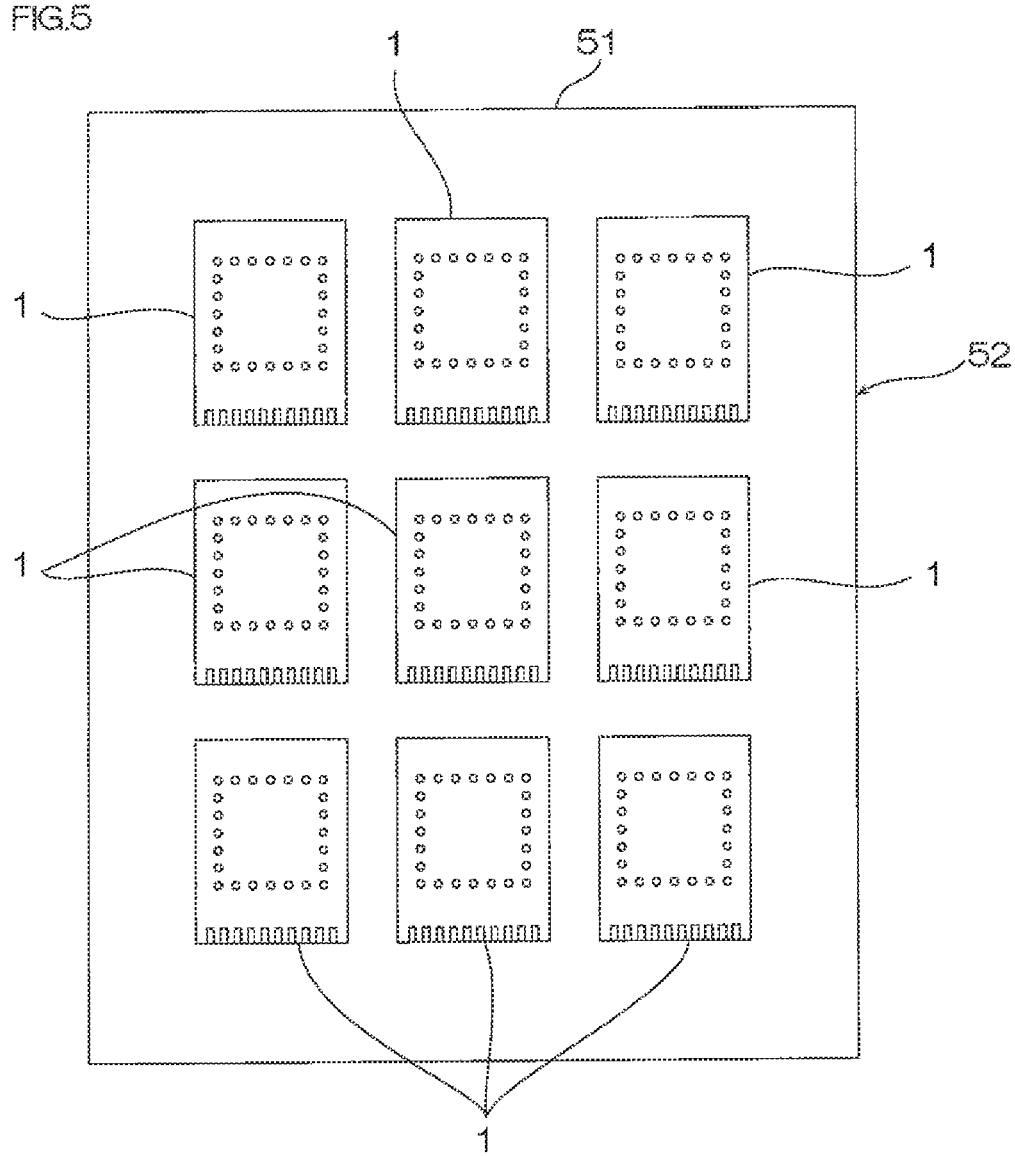
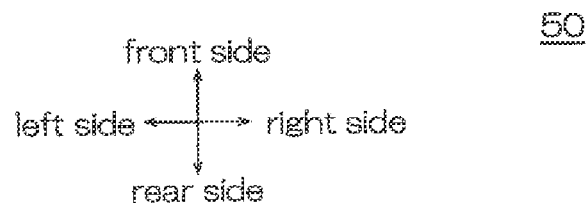

FIG.6
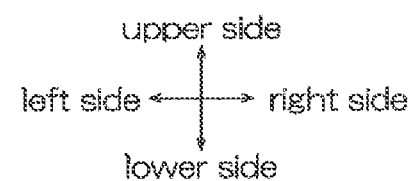
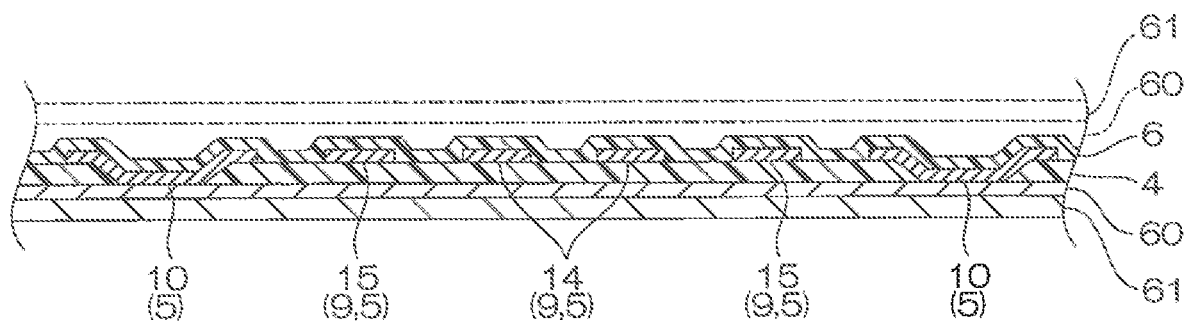

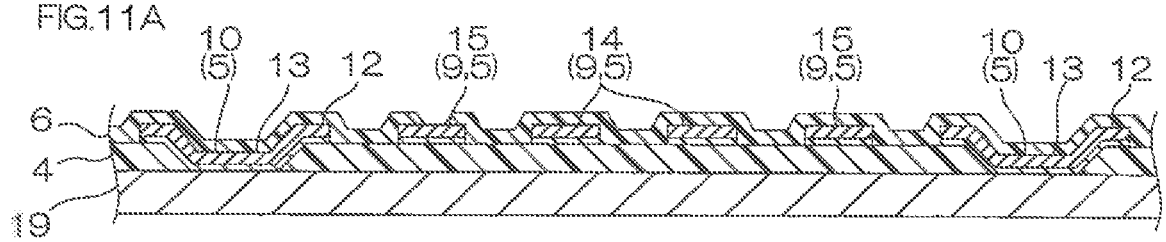
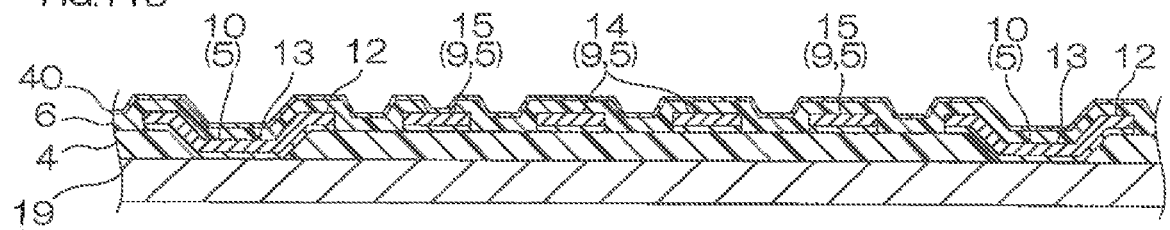
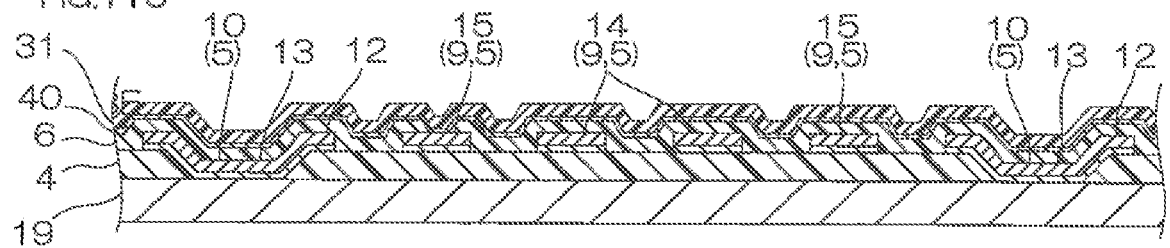
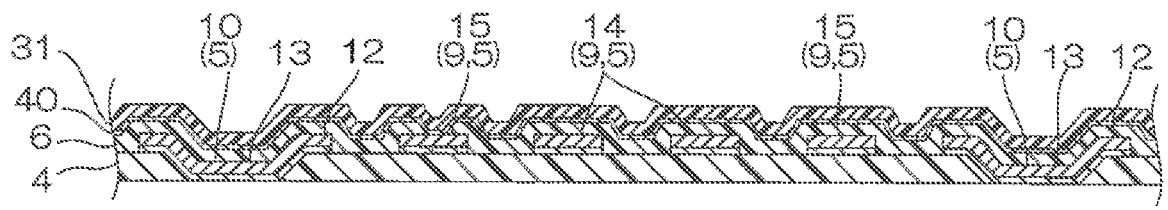

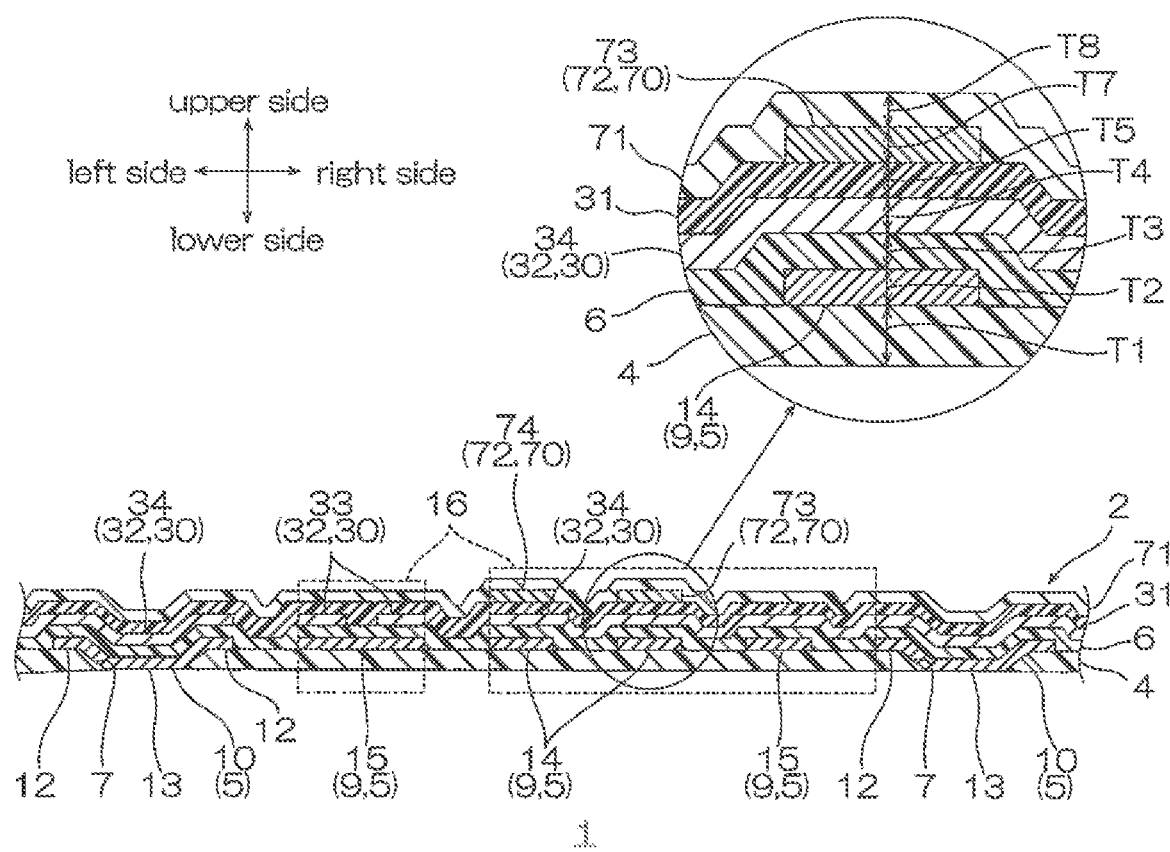

IMAGING ELEMENT MOUNTING BOARD, PRODUCING METHOD OF IMAGING ELEMENT MOUNTING BOARD, AND MOUNTING BOARD ASSEMBLY

CROSS-REFERENCE TO RELATED APPLICATIONS

The present application is a 35 U.S.C. 371 National Stage Entry of PCT/JP2018/014380, filed on Apr. 4, 2018, which claims priority from Japanese Patent Application No. 2017-077542, filed on Apr. 10, 2017, Japanese Patent Application No. 2017-201977 filed on Oct. 18, 2017, and Japanese Patent Application No. 2018-071825 filed on Apr. 3, 2018, the contents of all of which are herein incorporated by reference in their entirety.

TECHNICAL FIELD

The present invention relates to an imaging element mounting board, a method for producing an imaging element mounting board, and a mounting board assembly.

BACKGROUND ART

Conventionally, an imaging device such as camera module mounted on a cellular phone or the like has been generally mounted with an optical lens, a housing that houses and retains the optical lens, an imaging element such as CMOS sensor and CCD sensor, and an imaging element mounting board that is mounted with the imaging element for being electrically connected to an external wire. The imaging element is mounted on a generally central portion of the imaging element mounting board, and the housing is disposed on a peripheral end portion of the imaging element mounting board so as to surround the imaging element. Patent Document 1 discloses the board.

CITATION LIST

Patent Document

Patent Document 1: Japanese Unexamined Patent Publication No. 2005-210628

SUMMARY OF THE INVENTION

Problem to be Solved by the Invention

The imaging device used in the cellular phone or the like is required to further reduce its size (height) along with a demand for a smaller cellular phone. One of the methods of reducing the height of the imaging device includes a reduction in size of the imaging element mounting board.

Generally, in the imaging element mounting board, two types of a thick rigid-type wiring circuit board that reinforces the entire rear surface thereof with a metal plate and a thin flexible-type wiring circuit board (FPC) that does not reinforce the entire rear surface thereof with the metal plate are used.

The FPC is not reinforced with the metal plate, so that a reduction in size thereof is possible compared to the rigid-type wiring circuit board. However, on the other hand, materials for the imaging element and the imaging element mounting board are different from each other, so that when an imaging unit including the imaging element and the imaging element mounting board is placed under the external environment where a high temperature and a low temperature are repeated, thermal distortion may be generated to cause warping of the imaging unit. As a result, there is a disadvantage that a deviation is generated in the position of the imaging element and the optical lens, so that an image is distorted.

An object of the present invention is to provide an imaging element mounting board that is capable of reducing its size and suppressing the generation of warping, a method for producing an imaging element mounting board, and a mounting board assembly.

Means for Solving the Problem

The present invention [1] includes an imaging element mounting board for mounting an imaging element having a wire region including a first insulating layer, a metal wire disposed at one side in a thickness direction of the first insulating layer, and a second insulating layer disposed at one side in the thickness direction of the metal wire, wherein an equivalent elastic modulus of the wire region is 5 GPa or more and 55 GPa or less.

According to the imaging element mounting board, the equivalent elastic modulus is 5 GPa or more and 55 GPa or less, so that when the imaging unit including the imaging element and the imaging element mounting board is placed under the environment where the high temperature and the low temperature are repeated, the thermal distortion generated between the imaging element and the imaging element mounting board can be alleviated, and as a result, the warping of the imaging unit can be reduced. Also, a supporting board such as metal supporting plate is not required, so that a reduction in size is possible.

The present invention [2] includes the imaging element mounting board described in [1], wherein the metal wire has a thickness of 1 μm or more and 8 μm or less.

According to the imaging element mounting board, a reduction in size can be achieved, while the warping can be further reduced.

The present invention [3] includes the imaging element mounting board described in [1] or [2], wherein the imaging element mounting board has a total thickness of 40 μm or less.

According to the imaging element mounting board, a reduction in size can be achieved, while the warping can be further reduced.

The present invention [4] includes the imaging element mounting board described in any one of [1] to [3], wherein the wire region further includes a metal shield layer disposed at one side in the thickness direction of the second insulating layer and a third insulating layer disposed at one side in the thickness direction of the metal shield layer.

According to the imaging element mounting board, electromagnetic waves generated from the outside can be shielded by the metal shield layer, so that the reliability of the imaging device can be improved.

The present invention [5] includes the imaging element mounting board described in [4], wherein the imaging element mounting board includes a conductive pattern having a terminal and the metal wire, the metal wire includes a ground wire, and the metal shield layer is electrically connected to the ground wire.

According to the imaging element mounting board, the ground wire is disposed at one side in the thickness direction of the first insulating layer, so that there is no need for separately providing a layer for the ground wire. As a result, a reduction in size of the imaging element mounting board can be achieved.

The present invention [6] includes the imaging element mounting board described in [5], wherein the metal shield layer includes an inclined portion extending in an inclination direction that inclines with respect to the thickness direction, and being in contact with the ground wire.

According to the imaging element mounting board, the metal shield layer is formed so as to incline, so that the metal shield layer can be formed by sputtering, vapor deposition, or the like. Thus, a reduction in size of the shield layer can be achieved.

The present invention [7] includes the imaging element mounting board described in any one of [1] to [6], wherein in the wire region, a ratio of a total thickness of the metal with respect to a total thickness of the insulating layer is 0.10 or more and 0.70 or less.

According to the imaging element mounting board, a reduction in size can be achieved, while the warping can be further reduced.

The present invention [8] includes the imaging element mounting board described in [7], wherein in the wire region, a ratio of a total thickness of the metal with respect to a total thickness of the insulating layer is 0.20 or more and 0.70 or less.

According to the imaging element mounting board, a wire width can be narrowed, while the electrical properties are excellent, so that a degree of freedom in the wire design can be improved.

The present invention [9] includes the imaging element mounting board described in any one of [1] to [8] further including a supporting body and a pressure-sensitive adhesive layer.

According to the imaging element mounting board, the contamination and the blocking of the imaging element mounting board can be suppressed.

The present invention [10] includes a mounting board assembly including the plurality of imaging element mounting boards described in any one of [1] to [9].

According to the mounting board assembly, the plurality of imaging elements can be mounted on the plurality of imaging element mounting boards in parallel, so that the production efficiency is improved.

The present invention [11] includes the mounting board assembly described in [10] wound into a roll shape.

According to the mounting board assembly, the imaging element can be mounted on the imaging element mounting board by a roll-to-roll step, so that the production efficiency is improved.

The present invention [12] includes a method for producing the imaging element mounting board described in any one of [1] to [9] including the steps of preparing a metal supporting plate, forming a first insulating layer at one side in a thickness direction of the metal supporting plate, forming a metal wire at one side in the thickness direction of the first insulating layer, forming a second insulating layer at one side in the thickness direction of the metal wire, and removing the metal supporting plate.

According to the method for producing an imaging element mounting board, the imaging element mounting board that is capable of reducing the warping of the imaging unit can be produced. Also, the imaging element mounting board is produced on the metal supporting plate, so that its handling is easy. Also, after the imaging element mounting board is formed, the metal supporting plate is removed, so that a reduction in size of the imaging element mounting board can be achieved.

The present invention [13] includes the method for producing an imaging element mounting board described in [12] further including, after the step of forming the second insulating layer and before the step of removing the metal supporting plate, a step of forming a metal shield layer at one side in the thickness direction of the second insulating layer and a step of forming a third insulating layer at one side in the thickness direction of the metal shield layer.

According to the method for producing an imaging element mounting board, the imaging element mounting board that is capable of shielding the electromagnetic waves generated from the outside can be produced.

Effect of the Invention

The imaging element mounting board and the mounting board assembly of the present invention can achieve a reduction in size and suppress the generation of the warping. The method for producing an imaging element mounting board of the present invention can surely produce the thin imaging element mounting board that suppresses the generation of the warping.

BRIEF DESCRIPTION OF THE DRAWINGS

FIG. 1 shows a bottom view of a first embodiment of an imaging element mounting board of the present invention.

FIG. 2 shows an A-A cross-sectional view in the imaging element mounting board shown in FIG. 1.

FIG. 3A illustrating a step of preparing a metal supporting plate,

FIG. 3B illustrating a step of forming a base insulating layer,

FIG. 3C illustrating a step of forming a metal thin film,

FIG. 3D illustrating a step of forming a photo resist,

FIG. 3E illustrating a step of forming a conductive pattern,

FIG. 3F illustrating a step of removing the photo resist and the metal thin film, FIG. 3G illustrating a step of forming a cover insulating layer, and FIG. 3H illustrating a step of removing the metal supporting plate.

FIG. 4 shows an imaging device including the imaging element mounting board shown in FIG. 1.

FIG. 5 shows a bottom view of a mounting board assembly including the imaging element mounting board shown in FIG. 1.

FIG. 6 shows a cross-sectional view of a modified example (embodiment including a pressure-sensitive adhesive layer and a supporting body) of the imaging element mounting board shown in FIG. 1.

FIGS. 11A to 11D show production process views of the imaging element mounting board shown in FIG. 10:

FIG. 11A illustrating a step of forming a first cover insulating layer,

FIG. 11B illustrating a step of forming a shield layer,

FIG. 11C illustrating a step of forming a second cover insulating layer, and

FIG. 11D illustrating a step of removing a metal supporting plate.

FIG. 12 shows a cross-sectional view of a fourth embodiment (embodiment including a second conductive pattern, a second cover insulating layer, a third conductive pattern, and a third cover insulating layer) of an imaging element mounting board of the present invention.

DESCRIPTION OF EMBODIMENTS

Figure 3A:
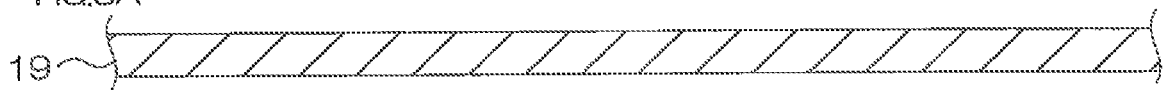
FIGS. 3A to 3H show production process views of the imaging element mounting board shown in FIG. 1.

In FIG. 1, the up-down direction on the plane of the sheet is a front-rear direction (first direction), the upper side on the plane of the sheet is a front side (one side in the first direction), and the lower side on the plane of the sheet is a rear side (the other side in the first direction). The right-left direction on the plane of the sheet is a right-left direction (second direction perpendicular to the first direction), the left side on the plane of the sheet is a left side (one side in the second direction), and the right side on the plane of the sheet is a right side (the other side in the second direction). The paper thickness direction on the plane of the sheet is an up-down direction (thickness direction, a third direction perpendicular to the first direction and the second direction), the far side on the plane of the sheet is an upper side (one side in the thickness direction, one side in the third direction), and the near side on the plane of the sheet is a lower side (the other side in the thickness direction, the other side in the third direction). To be specific, directions are in conformity with direction arrows described in each view.

First Embodiment

1. Imaging Element Mounting Board

An imaging element mounting board 1 (hereinafter, may be simply referred to as a mounting board) that is a first embodiment of an imaging element mounting board of the present invention is described with reference to FIGS. 1 to 4.

The mounting board 1 is a flexible wiring circuit board (FPC) for mounting an imaging element 21 (described later), and does not includes the imaging element 21 yet. As shown in FIG. 1, the mounting board 1 has a generally rectangular (rectangle-shaped) flat plate shape (sheet shape) when viewed from the top extending in the front-rear direction and right-left direction (plane direction).

As shown in FIG. 1, the mounting board 1 includes a housing disposed portion 2 and an external component connecting portion 3.

The housing disposed portion 2 is a portion in which a housing 22 (described later) and the imaging element 21 are disposed. To be specific, in a case where the housing 22 is disposed in the mounting board 1, the housing disposed portion 2 is a portion that is overlapped with the housing 22 when projected in the thickness direction. A plurality of imaging element connecting terminals 10 (described later) for being electrically connected to the imaging element 21 are disposed in a generally central portion of the housing disposed portion 2. The housing disposed portion 2 does not have a metal supporting plate 19 to be described later.

The external component connecting portion 3 is a region other than the housing disposed portion 2, and a portion for being connected to an external component. The external component connecting portion 3 is disposed at the rear side of the housing disposed portion 2 so that the front end edge of the external component connecting portion 3 is continuous to the rear end edge of the housing disposed portion 2. In the rear end edge of the external component connecting portion 3, a plurality of external component connecting terminals 11 (described later) for being electrically connected to the external component are disposed.

As shown in FIG. 2, the mounting board 1 includes a base insulating layer 4 as a first insulating layer, a conductive pattern 5, and a cover insulating layer 6 as a second insulating layer. Preferably, the mounting board 1 consists of only the base insulating layer 4, the conductive pattern 5, and the cover insulating layer 6.

The base insulating layer 4 forms the outer shape of the mounting board 1, and has a generally rectangular shape when viewed from the bottom. The lower surface of the base insulating layer 4 is formed flat. In the base insulating layer 4, a plurality of imaging element opening portions 7 and a plurality of external component opening portions 8 are formed.

The plurality of imaging element opening portions 7 are opening portions for exposing the imaging element connecting terminals 10 from the lower surface. The plurality of imaging element opening portions 7 are disposed in alignment at spaced intervals to each other so as to have a rectangular frame shape in the central portion of the housing disposed portion 2. Each of the imaging element opening portions 7 has a generally circular shape when viewed from the bottom passing through the base insulating layer 4 in the thickness direction. The imaging element opening portion 7 has a tapered shape in which the cross-sectional area is gradually reduced downwardly.

The plurality of external component opening portions 8 are opening portions for exposing the external component connecting terminals 11 from the lower surface. The external component opening portions 8 are disposed in alignment at spaced intervals to each other in the right-left direction in the rear end edge of the external component connecting portion 3. Each of the external component opening portions 8 has a generally rectangular shape (rectangle-shaped) when viewed from the bottom passing through the base insulating layer 4 in the thickness direction. The external component opening portion 8 is formed so as to extend from the rear end edge of the external component connecting portion 3 forwardly when viewed from the bottom.

The base insulating layer 4 is formed from an insulating material. Examples of the insulating material include synthetic resins such as polyimide resin, polyamide imide resin, acrylic resin, polyether nitrile resin, polyether sulfone resin, polyethylene terephthalate resin, polyethylene naphthalate resin, and polyvinyl chloride resin. Preferably, the base insulating layer 4 is formed from a polyimide resin.

Examples of the polyimide resin include materials described in Japanese Unexamined Patent Publications No. H07-179604, No. 2010-276775, and No. 2013-100441.

An elastic modulus of the base insulating layer 4 is, for example, 1 GPa or more, preferably 5 GPa or more, and for example, 20 GPa or less, preferably 15 GPa or less. The elastic modulus of a resin layer such as insulating layer can be, for example, measured by dynamic viscoelasticity measurement in conformity with JIS K7244 and ISO 6721.

A thermal expansion coefficient of the base insulating layer 4 is, for example, 1 ppm/K or more, preferably 5 ppm/K or more, and for example, 50 ppm/K or less, preferably 30 ppm/K or less. The thermal expansion coefficient of the resin layer such as insulating layer is a linear thermal expansion coefficient in the plane direction, and can be, for example, measured by thermomechanical analysis under the conditions of JIS K7197.

The base insulating layer 4 has a thickness $T_1$ of, for example, 1 μm or more, preferably 5 μm or more, and for example, 30 μm or less, preferably 10 μm or less, more preferably 8 μm or less.

The conductive pattern 5 is provided at the upper side of the base insulating layer 4 so as to be in contact with the upper surface of the base insulating layer 4. The conductive pattern 5 includes the plurality of imaging element connecting terminals 10, the plurality of external component connecting terminals 11, and a plurality of metal wires 9.

The plurality of imaging element connecting terminals 10 are disposed in alignment at spaced intervals to each other so as to be in a rectangular frame shape in the central portion of the housing disposed portion 2. That is, the plurality of imaging element connecting terminals 10 are provided so as to correspond to a plurality of terminals 25 (described later) of the imaging element 21 to be mounted. The plurality of imaging element connecting terminals 10 are provided corresponding to the plurality of imaging element opening portions 7. Each of the plurality of imaging element connecting terminals 10 has a generally circular shape when viewed from the bottom. The imaging element connecting terminal 10 is formed so as to protrude downwardly when viewed in side cross section. To be specific, the imaging element connecting terminal 10 integrally includes an outer peripheral portion 12 that is disposed at the outer periphery of the imaging element opening portion 7 and an inner side portion 13 that is disposed at the inside of the imaging element opening portion 7 so as to be recessed from the outer peripheral portion 12 inwardly. The lower surface (exposed surface) of the inner side portion 13 is exposed from the imaging element opening portion 7, and formed so as to be flat. The lower surface of the inner side portion 13 is formed so as to be flush with the lower surface of the base insulating layer 4.

The plurality of external component connecting terminals 11 are disposed in alignment at spaced intervals to each other in the right-left direction in the rear end edge of the external component connecting portion 3. That is, the plurality of external component connecting terminals 11 are provided so as to correspond to a plurality of terminals (not shown) of the external component. The plurality of external component connecting terminals 11 are provided corresponding to the plurality of external component opening portions 8. Each of the plurality of external component connecting terminals 11 has a generally rectangular shape (rectangle-shaped) when viewed from the top. The external component connecting terminal 11 is disposed at the inside of the external component opening portion 8, and the lower surface thereof is exposed from the external component opening portion 8.

The plurality of metal wires 9 include a plurality of connecting wires 14 and a plurality of ground wires 15.

The plurality of connecting wires 14 are wires for transmitting electrical signals, and provided so as to correspond to the plurality of imaging element connecting terminals 10 and the plurality of external component connecting terminals 11. To be specific, the connecting wire 14 is integrally formed so as to connect the imaging element connecting terminal 10 to the external component connecting terminal 11. That is, one end of the connecting wire 14 is continuous to the imaging element connecting terminal 10, and the other end thereof is continuous to the external component connecting terminal 11, so that the imaging element connecting terminal 10 is electrically connected to the external component connecting terminal 11.

The plurality of ground wires 15 are provided so as to correspond to the plurality of connecting wires 14. To be specific, the plurality of ground wires 15 are provided at the outer side of the plurality of connecting wires 14 along them. A ground terminal that is not shown is integrally connected to one end of the ground wire 15.

When the mounting board 1 is projected in the thickness direction, a region in which the metal wire 9 is present when viewed from the top or the bottom is defined as a wire region 16.

Examples of a material for the conductive pattern 5 include metal materials such as copper silver, gold, and nickel, and an alloy thereof, and solder. Preferably, copper is used.

The elastic modulus of the conductive pattern 5 is, for example, 50 GPa or more, preferably 100 GPa or more, and for example, 200 GPa or less, preferably 150 GPa or less. The elastic modulus of the metal such as conductive pattern can be, for example, measured by tensile test measurement in conformity with JIS Z 2241.

The thermal expansion coefficient of the conductive pattern 5 is, for example, 1 ppm/K or more, preferably 5 ppm/K or more, and for example, 30 ppm/K or less, preferably 20 ppm/K or less. The thermal expansion coefficient of the metal such as conductive pattern is a linear thermal expansion coefficient in the plane direction, and can be, for example, measured by a thermomechanical analysis device and an optical scanning measurement device in conformity with JIS Z 2285.

A difference of the thermal expansion coefficient between the conductive pattern 5 and the base insulating layer 4 is, for example, 20 ppm/K or less, preferably 10 ppm/K or less, more preferably 5 ppm/K or less. By setting the difference of the thermal expansion coefficient within the above-described range, in the imaging element mounting step such as reflow, the warping of the mounting board 1 can be suppressed, so that the imaging element 21 can be easily mounted on the mounting board 1.

In view of handleability and suppression of the warping, the conductive pattern 5 (the metal wire 9, each of the connecting terminals 10 and 11) has a thickness $T_2$ of, for example, 1 μm or more, preferably 3 μm or more, and for example, 15 μm or less, preferably 10 μm or less, more preferably 8 μm or less.

In the metal wire 9, the connecting wire 14 has a width of; for example, 5 μm or more, preferably 10 μm or more, and for example, 200 μm or less, preferably 100 μm or less, more preferably 50 μm or less.

The ground wire 15 has a width of, for example, 50 μm or more, preferably 100 μm or more, and for example, 5000 μm or less, preferably 3000 μm or less, more preferably 1000 μm or less.

The cover insulating layer 6 is provided at the upper side of the base insulating layer 4 and the conductive pattern 5 so as to cover the conductive pattern 5. That is, the cover insulating layer 6 is disposed so as to be in contact with the upper surface and the side surfaces of the conductive pattern 5, and a portion that is exposed from the conductive pattern 5 on the upper surface of the base insulating layer 4. The outer shape of the cover insulating layer 6 is formed so as to be the same as the base insulating layer 4 except for a forming portion of the external component connecting terminal 11.

The cover insulating layer 6 is formed from the same insulating material as that of the base insulating layer 4 described above. Preferably, the cover insulating layer 6 is formed from a polyimide resin.

The elastic modulus of the cover insulating layer 6 is, for example, 1 GPa or more, preferably 5 GPa or more, and for example, 20 GPa or less, preferably 15 GPa or less.

The thermal expansion coefficient of the cover insulating layer 6 is, for example, 1 ppm/K or more, preferably 5 ppm/K or more, and for example, 50 ppm/K or less, preferably 30 ppm/K or less.

A difference of the thermal expansion coefficient between the cover insulating layer 6 and the conductive pattern 5 is, for example, 20 ppm/K or less, preferably 10 ppm/K or less, more preferably 5 ppm/K or less. By setting the difference of the thermal expansion coefficient within the above-described range, in the imaging element mounting step such as reflow, the warping of the mounting board 1 can be suppressed, so that the imaging element 21 can be easily mounted on the mounting board 1.

The cover insulating layer 6 has a thickness $T_3$ of, for example, 1 μm or more, preferably 2 μm or more, and for example, 30 μm or less, preferably 10 μm or less, more preferably 5 μm or less.

An equivalent elastic modulus of the wire region 16 of the mounting board 1 is 5 GPa or more and 55 GPa or less. The equivalent elastic modulus thereof is preferably 10 GPa or more, and preferably 50 GPa or less, more preferably 40 GPa or less, further more preferably 30 GPa or less, particularly preferably 20 GPa or less. By setting the equivalent elastic modulus of the wire region 16 within the above-described range, the generation of the warping can be suppressed, and the handleability of the mounting board 1 is excellent.

The equivalent elastic modulus D is obtained by multiplying the elastic modulus of each of the layers that constitutes the wire region 16 (the base insulating layer 4, the metal wire 9, the cover insulating layer 6) by the thickness fraction of each of the layers to be added up. To be specific, in the embodiment of FIG. 1, the equivalent elastic modulus D is obtained by the following calculation formula.

$$D=\{D_1 \times T_1 + D_2 \times T_2 + D_3 \times T_3\}/\{T_1+T_2+T_3\}$$

$D_1$ shows the elastic modulus of the base insulating layer 4, and $T_1$ shows the thickness of the base insulating layer 4.

$D_2$ shows the elastic modulus of the metal wire 9, and $T_2$ shows the thickness of the metal wire 9.

$D_3$ shows the elastic modulus of the cover insulating layer 6, and $T_3$ shows the thickness of the cover insulating layer 6.

The above-described equivalent elastic modulus D is approximately derived from the Voigt law: $E_y=V_1E_1+V_2E_2$ ($E_y$ shows the Young's modulus of the total, $V_1$ shows the volume of the first layer, $E_1$ shows the Young's modulus of the material of the first layer, $V_2$ shows the volume of the second layer, and $E_2$ shows the Young's modulus of the material of the second layer) in a parallel flat plate model in which the first layer and the second layer are laminated.

In the wire region 16, a ratio of a total thickness of the metal with respect to a total thickness of the insulating layer, that is, a ratio ($T_2(T_1+T_3)$) of the thickness of the metal wire 9 with respect to the total thickness of the base insulating layer 4 and the cover insulating layer 6 is, for example, 0.05 or more, preferably 0.10 or more, more preferably 0.20 or more, and for example, 0.90 or less, preferably 0.70 or less, more preferably 0.50 or less, further more preferably 0.20 or less. By setting the above-described ratio within the above-described range, the equivalent elastic modulus can be easily adjusted in an appropriate range (for example, 5 GPa or more and 55 GPa or less), and as a result, the generation of the warping can be further more surely suppressed. In addition, when the above-described ratio is set in a range of 0.20 or more and 0.70 or less, the wire width of the connecting wire 14 can be further more surely narrowed, while the electrical properties of the metal wire 9 are excellent. Thus, a degree of freedom in the wire design can be improved, and even a smaller number (number of layer) of conductive pattern 5 can function as the mounting board 1.

In view of handleability and suppression of the warping, the metal has the total thickness (maximum thickness: in FIG. 2, the thickness of the metal wire 9) of, for example, 15 μm or less, preferably 10 μm or less, more preferably 8 μm or less, and for example, 1 μm or more.

In view of handleability and suppression of the warping, the mounting board 1 has the total thickness (maximum thickness) of, for example, 50 μm or less, preferably 40 μm or less, more preferably 30 μm or less, further more preferably 20 μm or less, particularly preferably 10 μm or less, and for example, 1 μm or more, preferably 5 μm or more.

2. Method for Producing Imaging Element Mounting Board

As shown in FIGS. 3A to 3H, the mounting board 1 is, for example, obtained by sequentially carrying out a metal supporting plate preparing step, a base insulating layer forming step, a metal thin film forming step, a photo resist forming step, a conductive pattern forming step, a photo resist and metal thin film removing step, a cover insulating layer forming step, and a metal supporting plate removing step.

As shown in FIG. 3A, in the metal supporting plate preparing step, the metal supporting plate 19 is prepared.

The metal supporting plate 19 is, for example, formed from a metal material such as stainless steel, 42-alloy, aluminum, and copper alloy. Preferably, the metal supporting plate 19 is formed from stainless steel.

The metal supporting plate 19 has a thickness of, for example, 5 μm or more, preferably 10 μm or more, and for example, 50 μm or less, preferably 30 μm or less.

The upper surface of the metal supporting plate 19 is formed so as to be flat (smooth).

Figure 3B:
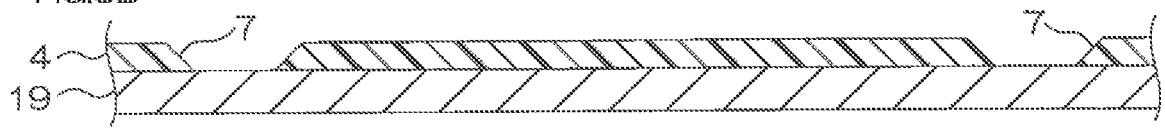

As shown in FIG. 3B, in the base insulating layer forming step, the base insulating layer 4 is formed on the upper surface of the metal supporting plate 19. That is, the base insulating layer 4 having the opening portions (the imaging element opening portion 7 and the external component opening portion 8) is formed on the upper surface of the metal supporting plate 19.

To be specific, a varnish of a photosensitive insulating material (for example, photosensitive polyimide) is applied to the entire upper surface of the metal supporting plate 19 to be dried, so that a base film (base insulating layer) is formed. Thereafter, the base film is exposed to light via a photomask having a pattern corresponding to the opening portions (the imaging element opening portion 7 and the external component opening portion 8). Thereafter, the base film is developed, and cured by heating as needed.

Figure 3C:
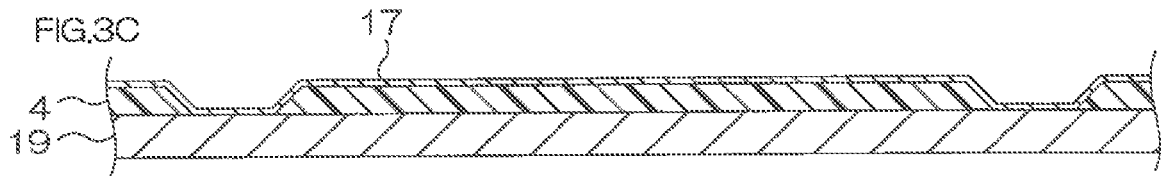

As shown in FIG. 3C, in the metal thin film forming step, a metal thin film 17 (seed film) is formed on the upper surface of the base insulating layer 4, and a portion that is exposed from the opening portion 7 on the upper surface of the metal supporting plate 19.

Examples of the metal thin film 17 include metal materials such as copper, chromium, and nickel, and an alloy thereof.

The metal thin film 17 is, for example, formed by carrying out a thin film forming method such as sputtering and plating with respect to the base insulating layer 4 that is formed on the metal supporting plate 19. Preferably, the metal thin film 17 is formed by sputtering.

The metal thin film 17 has a thickness of, for example, 10 nm or more, and for example, 300 nm or less.

Figure 3D:
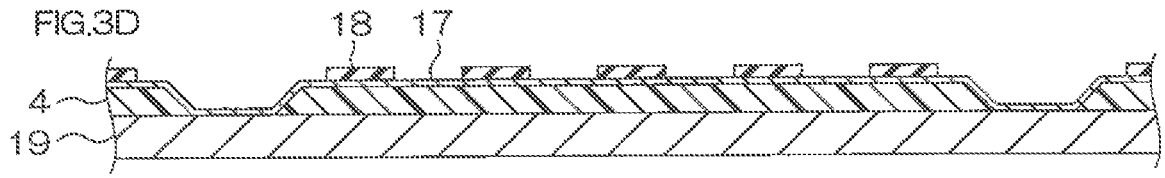

As shown in FIG. 3D, in the photo resist forming step, a photo resist 18 is formed on the metal thin film 17. That is, the photo resist 18 having an opening portion corresponding to the conductive pattern 5 is formed.

To be specific, a dry film resist is disposed on the entire upper surface of the metal thin film. Thereafter, the dry film resist is exposed to light via the photomask having a pattern corresponding to the conductive pattern 5. Thereafter, the dry film resist is developed, and cured by heating as needed, so that the photo resist 18 is formed as a plating resist.

In this manner, the metal thin film 17 in a portion corresponding to the conductive pattern 5 is exposed from the photo resist 18.

Figure 3E:
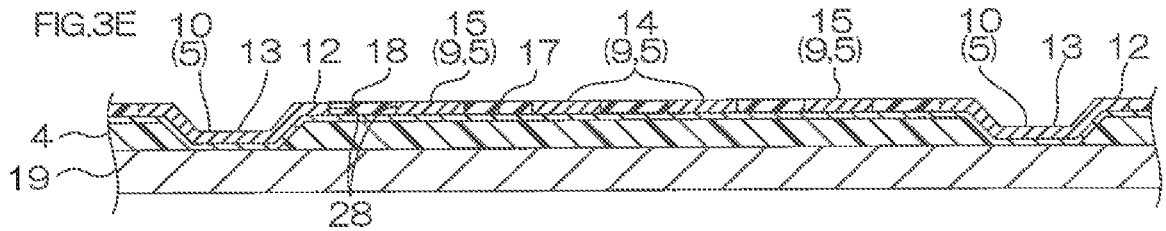

As shown in FIG. 3E, in the conductive pattern forming step, the conductive pattern 5 is formed in a portion that is exposed from the photo resist 18 on the surface of the metal thin film 17.

To be specific, for example, electrolytic plating in which electricity is supplied from the metal thin film 17 is carried out.

In this manner, the conductive pattern 5 having the imaging element connecting terminal 10, the external component connecting terminal 11, and the metal wire 9 is formed. The metal thin film 17 corresponding to the conductive pattern 5 is unified with a plating layer 28 by the electrolytic plating, thereby forming the conductive pattern 5 along with the plating layer 28. That is, in FIGS. 3D to 3H, each of the imaging element connecting terminal 10 and the metal wire 9 is illustrated to be two layers of the plating layer 28 and the metal thin film 17. Alternatively, the imaging element connecting terminal 10 and the metal wire 9 may be completely unified to be one layer (ref: FIG. 2).

Figure 3F:
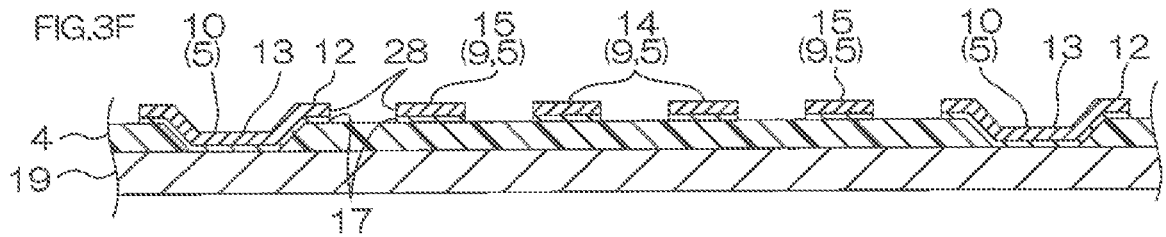
Figure 3G:
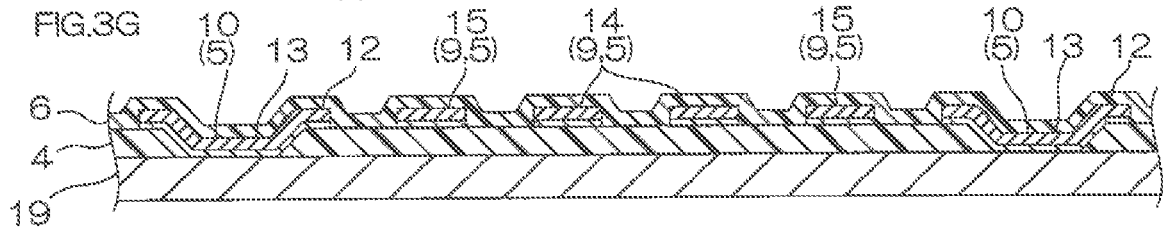

As shown in FIG. 3F, in the photo resist and metal thin film removing step, the photo resist 18 and the metal thin film 17 are removed.

To be specific, first, the remaining photo resist 18 is removed. For example, the photo resist 18 is removed by wet etching. Thereafter, the metal thin film 17 corresponding to the remaining photo resist 18 is removed. For example, the metal thin film 17 is removed by peeling or the wet etching.

As shown in FIG. 3Q in the cover insulating layer forming step, the cover insulating layer 6 is disposed on the upper surfaces of the conductive pattern 5 and the base insulating layer 4.

To be specific, for example, the cover insulating layer forming step is carried out in the same manner as that of the base insulating layer forming step.

In this manner, the mounting board 1 including the base insulating layer 4, the conductive pattern 5, and the cover insulating layer 6 is obtained in a state of being supported by the metal supporting plate 19.

Figure 3H:
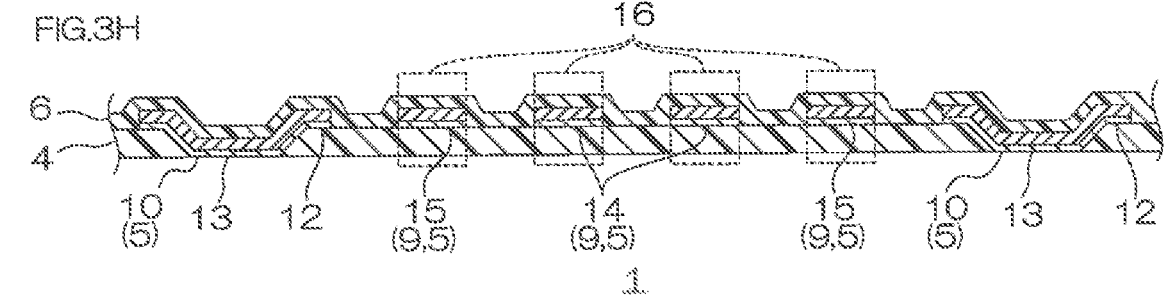

As shown in FIG. 3H, in the metal supporting plate removing step, the metal supporting plate 19 is removed.

Examples of a removing method include a method of removing the metal supporting plate 19 from the lower surface of the mounting board 1 and a method of processing the metal supporting plate 19 by the wet etching.

In this manner, the mounting board 1 including the base insulating layer 4, the conductive pattern 5, and the cover insulating layer 6 is obtained.

The mounting board 1 is, for example, used in a wiring circuit board for mounting the imaging element. That is, the mounting board 1 is used in an imaging device such as camera module.

3. Imaging Device

An imaging device 20 including the mounting board 1 is described with reference to FIG. 4.

The imaging device 20 includes the mounting board 1, the imaging element 21, the housing 22, an optical lens 23, and a filter 24.

The mounting board 1 in a state of FIG. 2 is reversed upside down to be used. That is, the mounting board 1 is disposed so that the base insulating layer 4 is the upper side and the cover insulating layer 6 is the lower side.

The imaging element 21 is a semiconductor element that converts light to electrical signals, and examples thereof include solid imaging elements such as CMOS sensor and CCD sensor.

The imaging element 21 has a generally rectangular flat plate shape when viewed from the top, and though not shown, includes a silicon such as Si board, and a photo diode (photoelectric converting element) and a color filter that are disposed thereon. A plurality of terminals 25 corresponding to the imaging element connecting terminal 10 of the mounting board 1 are provided on the lower surface of the imaging element 21.

The elastic modulus of the imaging element 21 (Si board in particular) is, for example, 100 GPa or more, preferably 120 GPa or more, and for example, 200 GPa or less, preferably 150 GPa or less. The elastic modulus of the imaging element 21 can be, for example, measured by the tensile test measurement in conformity with JIS Z 2241.

The thermal expansion coefficient of the imaging element 21 (Si board in particular) is, for example, 1 ppm/K or more, preferably 2 ppm/K or more, and for example, 10 ppm/K or less, preferably 5 ppm/K or less. The thermal expansion coefficient of the imaging element 21 is a linear thermal expansion coefficient in the plane direction, and can be, for example, measured by a thermomechanical analysis device and an optical scanning measurement device in conformity with JIS Z 2285.

The imaging element 21 has a thickness of, for example, 10 μm or more, preferably 50 μm or more, and for example, 1000 μm or less, preferably 500 pin or less.

The imaging element 21 is mounted on the mounting board 1. That is, the terminal 25 of the imaging element 21 is flip-chip mounted on the corresponding imaging element connecting terminal 10 of the mounting board 1 via a solder bump 26 or the like. In this manner, the imaging element 21 is disposed in the central portion of the housing disposed portion 2 of the mounting board 1 to be electrically connected to the imaging element connecting terminal 10 and the external component connecting terminal 11 of the mounting board 1.

The imaging element 21 is mounted on the mounting board 1 to constitute an imaging unit 27. That is, the imaging unit 27 includes the mounting board 1 and the imaging element 21 that is mounted thereon.

The housing 22 is disposed in the housing disposed portion 2 of the mounting board 1 at spaced intervals to the imaging element 21 so as to surround it. The housing 22 has a generally rectangular cylindrical shape when viewed from the top. In the upper end of the housing 22, a fixing portion for fixing the optical lens 23 is provided.

The optical lens 23 is disposed at the upper side of the mounting board 1 at spaced intervals to the mounting board 1 and the imaging element 21. The optical lens 23 has a generally circular shape when viewed from the top, and fixed by the fixing portion so that light from the outside reaches the imaging element 21.

The filter 24 is disposed in the center in the up-down direction of the imaging element 21 and the optical lens 23 at spaced intervals thereto, and fixed to the housing 22.

The mounting board 1 has the wire region 16 including the base insulating layer 4, the metal wire 9 that is disposed at the upper side of the base insulating layer 4, and the cover insulating layer 6 that is disposed at the upper side of the metal wire 9. The equivalent elastic modulus of the wire region 16 is 5 GPa or more and 55 GPa or less.

Thus, when the imaging unit 27 is placed under the environment where the high temperature and the low temperature are repeated, the thermal distortion generated between the imaging element 21 and the mounting board 1 can be alleviated, and as a result, the warping of the imaging unit 27 can be reduced.

In a conventional mounting board (FPC board), the thermal expansion coefficient of a wire region is above 15 ppm/K. Meanwhile, an imaging element includes a Si board or the like, so that the thermal expansion coefficient thereof is generally below 10 ppm/K. When the imaging element is mounted on a mounting board by thermal treatment, a difference in the thermal expansion coefficient generates significant warping of the mounting board.

In contrast, in the mounting board 1, the equivalent elastic modulus of the wire region 16 is 5 GPa or more and 55 GPa or less. Thus, the mounting board 1 can be flexibly deformed in accordance with the thermal expansion of the imaging element 21 with respect to a heat cycle (for example, a difference in temperature of 50° C. or more). As a result, the generation of the warping can be suppressed.

Also, a supporting body such as metal supporting plate is not required, so that a reduction in size is possible.

Also, the mounting board 1 has a flat surface for mounting, that is, as shown in FIG. 1, the lower surface of the base insulating layer 4 is flat and flush with and the exposed surface (the inner side portion 13) of the imaging element connecting terminal 10. Thus, when the imaging element 21 is mounted, the collision of the terminal 25 of the imaging element 21 with a protruding portion of the base insulating layer 4 can be suppressed. As a result, the mounting is easy.

The mounting board 1 does not require an adhesive layer such as acrylic adhesive, so that the deterioration of the adhesive layer by wet heat can be suppressed, and excellent wet heat resistance can be achieved.

The method for producing the mounting board 1 includes a step of preparing the metal supporting plate 19, a step of forming the base insulating layer 4 on the upper surface of the metal supporting plate 19, a step of forming the metal wire 9 on the upper surface of the base insulating layer 4, a step of forming the cover insulating layer 6 on the upper surface of the metal wire 9, and a step of removing the metal supporting plate 19.

That is, the mounting board 1 is produced on the hard metal supporting plate 19, so that its handling is easy. When the thickness of the base insulating layer 4 is thin, the metal supporting plate 19 supports the base insulating layer 4, so that the metal wire 9 and the cover insulating layer 6 can be surely disposed on the base insulating layer 4. As a result, a reduction in size of the base insulating layer 4, and accordingly, a reduction in size of the mounting board 1 can be achieved.

When the base insulating layer 4 and the cover insulating layer 6 are formed by using a photosensitive insulating material, the adhesive layer is not required between gaps of the base insulating layer 4, the conductive pattern 5, and the cover insulating layer 6, and the layers can be laminated. Thus, the improvement of the heat resistance, and a reduction in size can be further achieved.

4. Mounting Board Assembly

The mounting board 1 is industrially produced and used as an assembly of the plurality of mounting boards 1. As shown in FIG. 5, a mounting board assembly 50 has a generally rectangular (generally square) flat plate shape (sheet shape) when viewed from the top extending in the plane direction, and includes the plurality of (nine) mounting boards 1 and a margin portion 51.

The plurality of mounting boards 1 are uniformly disposed in alignment at spaced intervals to each other in the front-rear direction and the right-left direction.

The margin portion 51 is a portion other than the plurality of mounting boards 1, and disposed in a gap between the mounting boards 1 that are next to each other and at the outer side of the mounting board 1 that is disposed at the outer side. The margin portion 51 includes at least the base insulating layer 4 and the cover insulating layer 6.

In the mounting board assembly 50, the plurality of (nine) mounting boards 1 that are disposed at equally spaced intervals to each other and the margin portion 51 constitute one assembly portion 52.

According to the mounting board assembly 50, by mounting the plurality of imaging elements 21 on the plurality of mounting boards 1 in parallel, the imaging unit 27 can be simultaneously produced. Thus, the production efficiency of the imaging device 20 can be improved.

In the metal supporting plate preparing step, the metal supporting plate 19 having a size capable of disposing the plurality of mounting boards 1 therein is prepared, the plurality of mounting boards 1 are simultaneously produced in the same step as the above-described method for producing the mounting board 1, and in the metal supporting plate removing step, the metal supporting plate 19 is removed, so that the mounting board assembly 50 can be produced.

5. Modified Example

In the mounting board 1 of the embodiment shown in FIG. 2, the metal wire 9 includes the ground wire 15. Alternatively, for example, though not shown, the metal wire 9 may not include the ground wire 15. That is, the metal wire 9 can also consist of only the connecting wire 14.

In the mounting board 1 of the embodiment shown in FIG. 2, for example, though not shown, the metal wire 9 may also include another wire such as power source wire. A region in which the power source wire is present is also the wire region 16.

In the imaging device 20 of the embodiment shown in FIG. 4, the imaging element 21 is flip-chip mounted on the mounting board 1. Alternatively, for example, though not shown, the imaging element 21 can be also mounted on the mounting board 1 by wire bonding.

In the mounting board 1 shown in FIG. 2, the pressure-sensitive adhesive layer and the supporting body are not included. Alternatively, for example, as shown in FIG. 6, the mounting board 1 can also include a pressure-sensitive adhesive layer 60 and a supporting body 61.

To be specific, the mounting board 1 shown in FIG. 6 includes the pressure-sensitive adhesive layer 60 that is disposed on the lower surface of the base insulating layer 4 and the supporting body 61 that is disposed on the lower surface of the pressure-sensitive adhesive layer 60. The pressure-sensitive adhesive layer 60 and the supporting body 61 are disposed in the mounting board 1 at the time of the conveyance and the storage of the mounting board 1, and peeled at the time of the mounting of the imaging element 21 and the use of the mounting board 1.

Examples of the pressure-sensitive adhesive layer 60 include known pressure-sensitive adhesive layers such as double-sided pressure-sensitive adhesive tape.

Examples of the supporting body 61 include known films such as surface protecting film and release film.

Examples of a laminate of the pressure-sensitive adhesive layer 60 and the supporting body 61 include known ultraviolet ray peeling tapes.

According to the mounting board 1 shown in FIG. 6, the contamination and the blocking of the mounting board 1 can be suppressed at the time of the conveyance and the storage of the mounting board 1.

In the mounting board 1, as shown by a phantom line of FIG. 6, the pressure-sensitive adhesive layer 60 and the supporting body 61 can be also provided on the upper surface of the base insulating layer 4 in addition to the lower surface of the base insulating layer 4 or instead of the lower surface of the base insulating layer 4.

Figure 7:
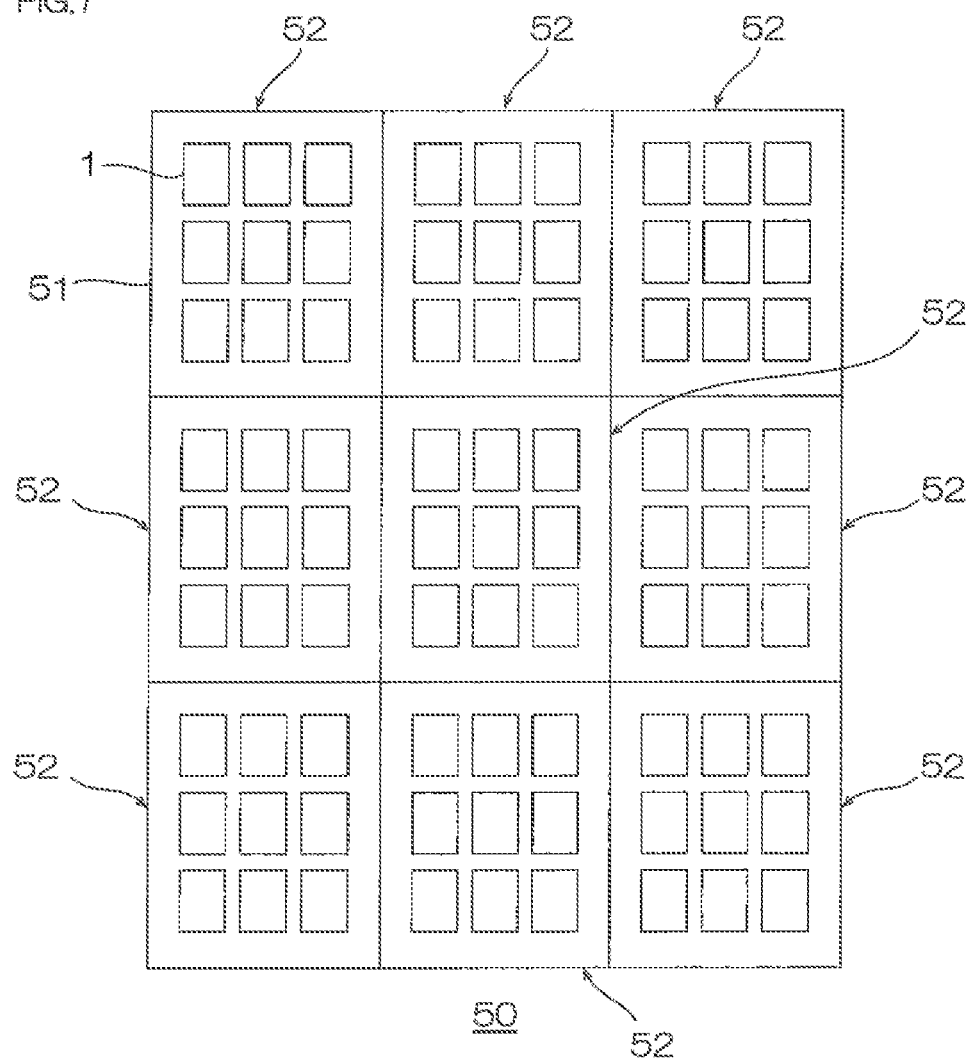
FIG. 7 shows a bottom view of a modified example (embodiment including a plurality of assembly portions) of the mounting board assembly shown in FIG. 5.

The mounting board assembly 50 shown in FIG. 5 consists of the one assembly portion 52. Alternatively, for example, as shown in FIG. 7, the mounting board assembly 50 can also include the plurality of (nine) assembly portions 52. Although not shown, the number of the mounting board 1 in the one assembly portion 52 and that of the assembly portion 52 are not limited. The number thereof may be, for example, eight or less, and for example, 10 or more.

The mounting board assembly 50 shown in FIG. 5 has a generally square shape sheet (paper sheet) when viewed from the top. Alternatively, for example, as shown in FIG. 8, the mounting board assembly 50 has a sheet that is long in one direction and may be wound into a roll shape.

Figure 8:
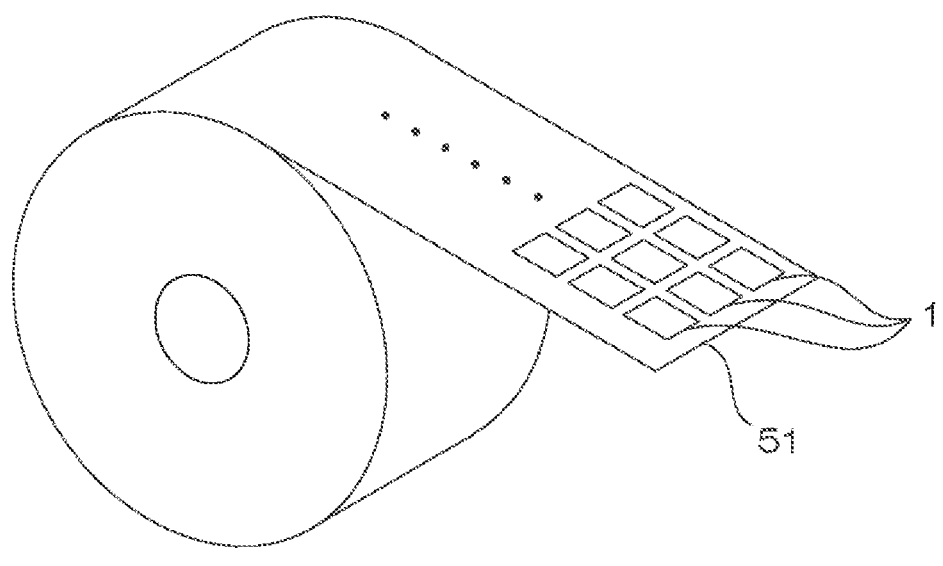
FIG. 8 shows a perspective view of a modified example (embodiment of being formed into a roll shape) of the mounting board assembly shown in FIG. 5.

According to the mounting board assembly 50 shown in FIG. 8, the imaging unit 27 can be produced by a roll-to-roll step, so that the production efficiency of the imaging device 20 is improved.

Second Embodiment

Figure 9:
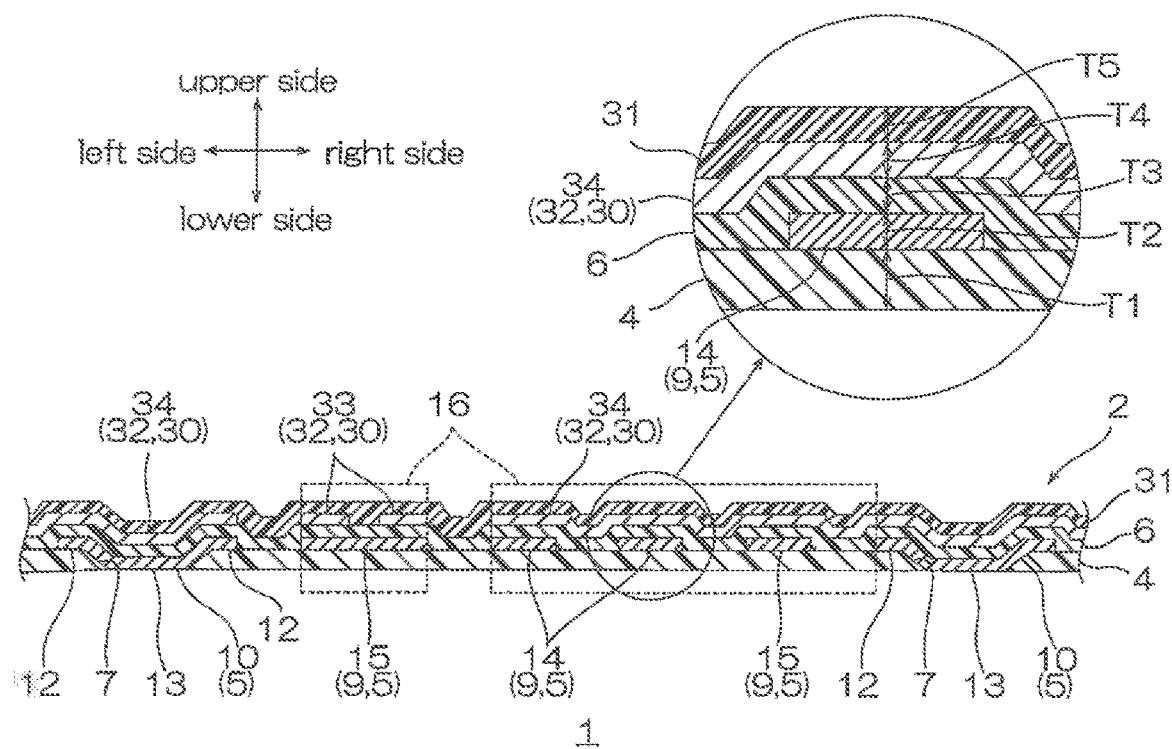
FIG. 9 shows a cross-sectional view of a second embodiment (embodiment including a second conductive pattern and a second cover insulating layer) of an imaging element mounting board of the present invention.

Next, a second embodiment of the mounting board is described with reference to FIG. 9. In the mounting board 1 of the second embodiment, the same reference numerals are provided for members corresponding to each of those in the above-described first embodiment shown in FIG. 2, and their detailed description is omitted.

In the first embodiment, the mounting board 1 includes the base insulating layer 4, the conductive pattern 5, and the cover insulating layer 6. As shown in FIG. 9, in the second embodiment, the mounting board 1 further includes a second conductive pattern 30 and a second cover insulating layer 31 as a third insulating layer.

That is, in the second embodiment, the mounting board 1 includes the base insulating layer 4, the conductive pattern (the first conductive pattern) 5, the cover insulating layer (the first cover insulating layer) 6, the second conductive pattern 30, and the second cover insulating layer 31. Preferably, in the second embodiment, the mounting board 1 consists of only the base insulating layer 4, the conductive pattern 5, the cover insulating layer 6, the second conductive pattern 30, and the second cover insulating layer 31.

The second conductive pattern 30 is provided at the upper side of the cover insulating layer 6 so as to be in contact with the upper surface of the cover insulating layer 6. The second conductive pattern 30 includes a plurality of second imaging element connecting terminals (not shown), a plurality of second external component connecting terminals (not shown), and a plurality of second metal wires 32.

The plurality of second imaging element connecting terminals are formed so as to be exposed from a second connecting element connecting terminal opening portion (not shown) that is formed in the base insulating layer 4.

The plurality of second external component connecting terminals are formed so as to be exposed from the second external component connecting terminal opening portion (not shown) that is formed in the base insulating layer 4.

The plurality of second metal wires 32 include a plurality of second connecting wires 33 and a plurality of second ground wires 34. The plurality of second connecting wires 33 are provided corresponding to the plurality of second imaging element connecting terminals and the plurality of second external component connecting terminals so as to connect them. The plurality of second ground wires 34 are provided so as to correspond to the plurality of second connecting wires 33.

The material, the elastic modulus, and the thermal expansion coefficient of the second conductive pattern 30 are the same as the material, the elastic modulus, and the thermal expansion coefficient of the conductive pattern 5, respectively.

A thickness $T_4$ of the second conductive pattern 30 and the width of the second metal wire 32 are the same as the thickness $T_2$ of the conductive pattern 5 and the width of the metal wire 9, respectively.

The second cover insulating layer 31 is provided at the upper side of the cover insulating layer 6 and the second conductive pattern 30 so as to cover the second conductive pattern 30. That is, the second cover insulating layer 31 is disposed so as to be in contact with the upper surface and the side surfaces of the second conductive pattern 30, and a portion that is exposed from the second conductive pattern 30 on the upper surface of the cover insulating layer 6. The outer shape of the second cover insulating layer 31 is formed so as to be the same as the base insulating layer 4.

The material, the elastic modulus, the thermal expansion coefficient, and a thickness $T_5$ of the second cover insulating layer 31 are the same as the material, the elastic modulus, the thermal expansion coefficient, and the thickness $T_3$ of the cover insulating layer 6, respectively.

When the mounting board 1 is projected in the thickness direction, a region in which at least one of the metal wire 9 and the second metal wire 32 is present when viewed from the top or the bottom is defined as the wire region 16 (excluding a terminal region in which terminals such as the imaging element connecting terminal 10 and the second imaging element connecting terminal are present when viewed from the top).

The equivalent elastic modulus D of the second embodiment is the same as the equivalent elastic modulus D of the first embodiment, and is 5 GPa or more and 55 GPa or less. The equivalent elastic modulus D of the second embodiment is preferably 10 GPa or more, and preferably 50 GPa or less. In a wire region in which the base insulating layer 4, the conductive pattern 5 (the metal wire 9), the cover insulating layer 6, the second conductive pattern 30 (the second metal wire 32), and the second cover insulating layer 31 are laminated, the equivalent elastic modulus D of the second embodiment is shown by the following formula.

$$D=\{D_1\times T_1+D_2\times T_2+D_3\times T_3+D_4\times T_4+D_5\times T_5\}/\{T_1+T_2+T_3+T_4+T_5\}$$

$D_4$ shows the elastic modulus of the second metal wire 32, and $T_4$ shows the thickness of the second metal wire 32.

$D_5$ shows the elastic modulus of the second cover insulating layer 31, and $T_5$ shows the thickness of the second cover insulating layer 31.

In the wire region 16, a ratio of the total thickness of the metal with respect to the total thickness of the insulating layer, that is, a ratio $(T_2+T_4/(T_1+T_3+T_5))$ of the total thickness of the metal wire 9 and the second metal wire 32 with respect to the total thickness of the base insulating layer 4, the cover insulating layer 6, and the second cover insulating layer 31 is, for example, 0.05 or more, preferably 0.10 or more, more preferably 0.20 or more, and for example, 0.90 or less, preferably 0.70 or less.

The total thickness (the total thickness of the metal wire 9 and the second metal wire 32) of the metal is the same as the total thickness of the first embodiment.

After the mounting board 1 of the first embodiment is obtained in a state of being supported by the metal supporting plate 19, the second conductive pattern 30 and the second cover insulating layer 31 are formed on the upper surface of the first cover insulating layer 6 in this order, and subsequently, the metal supporting plate 19 is removed, so that the mounting board 1 of the second embodiment can be produced.

In the second embodiment, the same function and effect as that of the first embodiment can be achieved. Also, in the second embodiment, the same modified example as that of the first embodiment can be applied.

Third Embodiment

Figure 10:
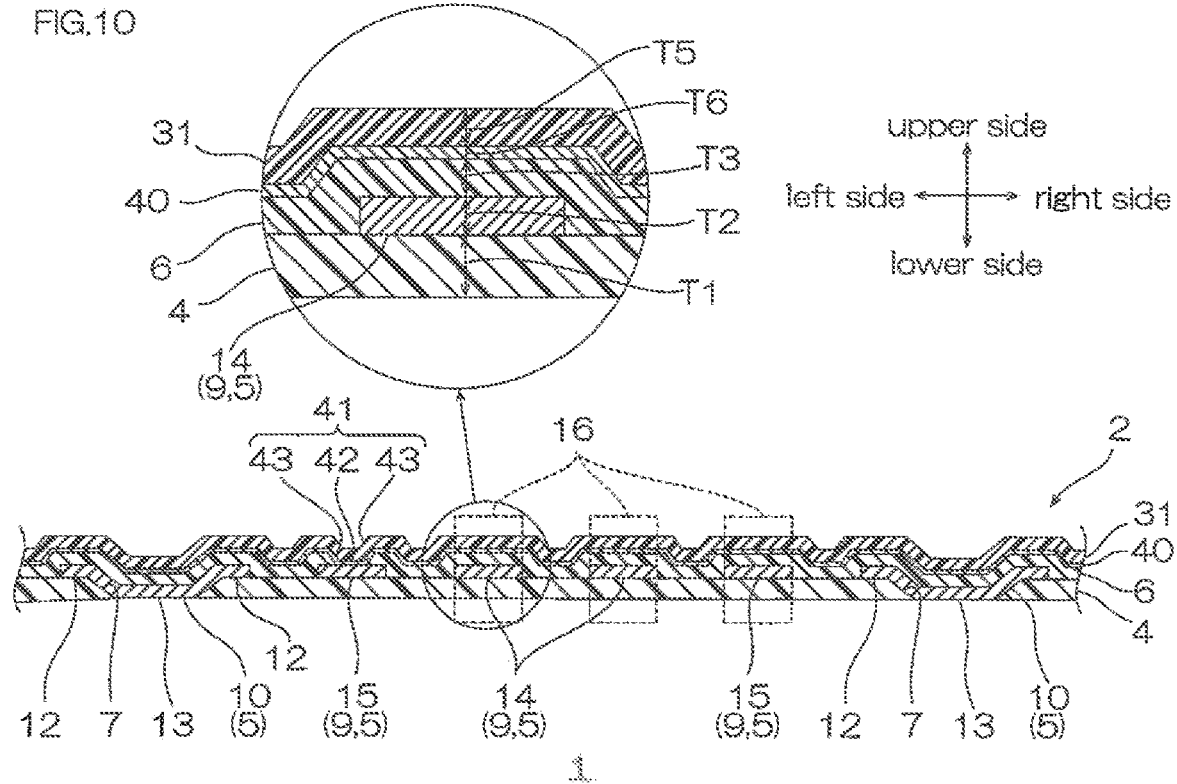
FIG. 10 shows a cross-sectional view of a third embodiment (embodiment including a metal shield layer and a second cover insulating layer) of an imaging element mounting board of the present invention.

Next, a third embodiment of the mounting board is described with reference to FIG. 10. In the mounting board 1 of the third embodiment, the same reference numerals are provided for members corresponding to each of those in the above-described first to second embodiments shown in FIGS. 2 and 9, and their detailed description is omitted.

In the first embodiment, the mounting board 1 includes the base insulating layer 4, the conductive pattern 5, and the cover insulating layer 6. As shown in FIG. 10, in the third embodiment, for example, the mounting board 1 further includes a metal shield layer 40 and the second cover insulating layer 31 as the third insulating layer. Preferably, in the third embodiment, the mounting board 1 consists of only the base insulating layer 4, the conductive pattern 5, the cover insulating layer 6, the metal shield layer 40, and the second cover insulating layer 31.

That is, in the third embodiment, the mounting board 1 includes the base insulating layer 4, the conductive pattern 5, the cover insulating layer (the first cover insulating layer) 6, the metal shield layer 40, and the second cover insulating layer 31.

The metal shield layer 40 is disposed at the upper side of the cover insulating layer 6 so as to be in contact with the upper surface of the cover insulating layer 6. The metal shield layer 40 is a layer that shields the electromagnetic waves from the outside, and has a sheet shape extending in the plane direction (the front-rear direction and the right-left direction).

The metal shield layer 40 is electrically connected to the ground wire 15. That is, the metal shield layer 40 is continuous to the ground wire 15. To be specific, the metal shield layer 40 has a protruding shape downwardly in a portion that faces the ground wire 15, and includes a contact portion 41 that is in contact with the upper surface of the ground wire 15.

The contact portion 41 includes a flat portion 42 that is in direct contact with the ground wire 15, and an inclined portion 43 that is integrally disposed so as to be continuous to the periphery of the flat portion 42.

The flat portion 42 has a flat plate shape extending in the plane direction.

The inclined portion 43 extends in an inclination direction that crosses (inclines) in the up-down direction and the plane direction.

When viewed in side cross section, an angle made between the flat portion 42 and the inclined portion 43 is, for example, 100° or more, preferably 120° or more, and for example, 170° or less, preferably 160° or less.

In this manner, the metal shield layer 40 is grounded via the ground wire 15.

The metal shield layer 40 is made of a metal conductor, and metal materials such as copper, chromium, nickel, gold, silver, platinum, palladium, titanium, tantalum, and solder, and an alloy thereof are used. Preferably, copper is used.

The metal shield layer 40 has a thickness $T_6$ of, for example, 0.05 µm or more, preferably 0.1 µm or more, and for example, 3 µm or less, preferably 1 µm or less.

The second cover insulating layer 31 is provided at the upper side of the metal shield layer 40 so as to cover the metal shield layer 40. The outer shape of the second cover insulating layer 31 is formed so as to be the same as that of the cover insulating layer 6.

The material, the elastic modulus, the thermal expansion coefficient, and the thickness $T_5$ of the second cover insulating layer 31 in the third embodiment are the same as those of the second cover insulating layer 31 in the second embodiment, that is, the same as the material, the elastic modulus, the thermal expansion coefficient, and the thickness $T_3$ of the cover insulating layer 6, respectively.

The equivalent elastic modulus D of the third embodiment is the same as the equivalent elastic modulus D of the first embodiment, and is 5 GPa or more and 55 GPa or less. The equivalent elastic modulus D of the third embodiment is preferably 10 GPa or more, and preferably 50 GPa or less. In a wire region in which the base insulating layer 4, the conductive pattern 5 (the metal wire 9), the cover insulating layer 6, the metal shield layer 40, and the second cover insulating layer 31 are laminated, the equivalent elastic modulus D of the third embodiment is shown by the following formula.

$$D=\{D_1\times T_1+D_2\times T_2+D_3\times T_3+D_6\times T_6+D_5\times T_5\}/(\{T_1+T_2+T_3+T_3+T_5\}$$

$D_6$ shows the elastic modulus of the metal shield layer 40, and $T_6$ shows the thickness of the metal shield layer 40.

In the wire region 16, a ratio of the total thickness of the metal with respect to the total thickness of the insulating layer, that is, a ratio $(T_2+T_6/(T_1+T_3+T_5))$ of the total thickness of the metal wire 9 and the metal shield layer 40 with respect to the total thickness of the base insulating layer 4, the cover insulating layer 6, and the second cover insulating layer 31 is, for example, 0.05 or more, preferably 0.10 or more, more preferably 0.20 or more, and for example, 0.90 or less, preferably 0.70 or less.

The total thickness (the total thickness of the metal wire 9 and the metal shield layer 40) of the metal is the same as the total thickness of the first embodiment.

After the mounting board 1 of the first embodiment is obtained in a state of being supported by the metal supporting plate 19, the metal shield layer 40 and the second cover insulating layer 31 are formed on the upper surface of the first cover insulating layer 6 in this order, and subsequently, the metal supporting plate 19 is removed, so that the mounting board 1 of the third embodiment can be produced.

That is, the metal supporting plate preparing step, the base insulating layer forming step, the metal thin film forming step, the photo resist forming step, the conductive pattern forming step, the photo resist and metal thin film removing step, the cover insulating layer forming step, a shield layer forming step, a second cover insulating layer forming step, and the metal supporting plate removing step are carried out.

The metal supporting plate preparing step, the base insulating layer forming step, the metal thin film forming step, the photo resist forming step, the conductive pattern forming step, and the photo resist and metal thin film removing step are the same as those in the first embodiment (ref: FIGS. 3A to 3G).

As shown in FIG. 11A, in the cover insulating layer forming step, the cover insulating layer (the first cover insulating layer) 6 is disposed on the upper surfaces of the conductive pattern 5 and the base insulating layer 4.

At this time, the cover insulating layer 6 having a ground opening portion 44 is formed so as to expose the upper surface of the ground wire 15 of the conductive pattern 5. Also, the cover insulating layer 6 is formed so that the ground opening portion 44 has a tapered shape in which the width thereof is gradually reduced downwardly when viewed in side cross section. To be specific, for example, the cover insulating layer forming step is carried out in the same manner as that of the base insulating layer forming step.

As shown in FIG. 11B, in the shield layer forming step, the metal shield layer 40 is formed on the cover insulating layer 6.

In the forming of the metal shield layer 40, for example, a plating method such as electrolytic plating and electroless plating, a sputtering method, a vapor deposition method, an ion plating method, and an application method by a conductive paste are used. Preferably, in view of reduction in size, a sputtering method and a vapor deposition method are used, more preferably, a sputtering method is used.

As shown in FIG. 11C, in the second cover insulating layer forming step, the second cover insulating layer 31 is disposed on the upper surface of the metal shield layer 40. To be specific, the second cover insulating layer forming step is carried out in the same manner as that of the base insulating layer forming step.

In this manner, the mounting board 1 including the base insulating layer 4, the conductive pattern 5, the cover insulating layer 6, the metal shield layer 40, and the second cover insulating layer 31 is obtained in a state of being supported by the metal supporting plate 19.

As shown in FIG. 11D, in the metal supporting plate removing step, the metal supporting plate 19 is removed. To be specific, the same method as that of the first embodiment is used.

In this manner, the mounting board 1 including the base insulating layer 4, the conductive pattern 5, the cover insulating layer 6, the metal shield layer 40, and the second cover insulating layer 31 is obtained.

In the third embodiment, the same function and effect as that of the first embodiment can be achieved. Also, in the third embodiment, the same modified example as that of the first embodiment can be applied.

In the third embodiment, the wire region 16 includes the metal shield layer 40 that is disposed at the upper side of the cover insulating layer 6 and the second cover insulating layer 31 that is disposed at the upper side of the metal shield layer 40. Thus, the electromagnetic waves generated from the outside can be shielded by the metal shield layer 40, so that the reliability of the imaging device 20 can be improved.

The metal wire 9 includes the connecting wire 14 and the ground wire 15, and the metal shield layer 40 is electrically connected to the ground wire 15.

Thus, the ground wire 15 is disposed on the upper surface of the base insulating layer 4, that is, on the same position in the up-down direction as the connecting wire 14. Thus, there is no need for separately providing a layer for providing the ground wire 15. As a result, a reduction in size of the mounting board 1 can be achieved.

The metal shield layer 40 includes the inclined portion 43 extending in the inclination direction that inclines in the up-down direction and the plane direction and being in contact with the ground wire 15. That is, the metal shield layer 40 is formed so that a portion thereof is inclined. Thus, the metal shield layer 40 can be formed by the sputtering, the vapor deposition, or the like. That is, the metal shield layer 40 can function as a sputtering film or the like. Thus, a reduction in size of the mounting board 1 can be achieved. In the contact portion 41 of the metal shield layer 40, a vertical portion along the up-down direction can be used instead of the inclined portion 43. However, in the embodiment including the vertical portion, the uniform metal shield layer 40 (vertical portion) cannot be formed by a film forming method such as sputtering and vapor deposition, and it may be difficult to achieve a reduction in size by the sputtering film or the like.

Fourth Embodiment

Next, a fourth embodiment of the mounting board is described with reference to FIG. 12. In the mounting board 1 of the fourth embodiment, the same reference numerals are provided for members corresponding to each of those in the above-described first to third embodiments shown in FIGS. 2, 9, and 11, and their detailed description is omitted.

In the second embodiment, the mounting board 1 includes the base insulating layer 4, the conductive pattern 5, the cover insulating layer 6, the second conductive pattern 30, and the second cover insulating layer 31. As shown in FIG. 12, in the fourth embodiment, the mounting board 1 further includes a third conductive pattern 70 and a third cover insulating layer 71.

That is, in the fourth embodiment, the mounting board 1 includes the base insulating layer 4, the conductive pattern (the first conductive pattern) 5, the cover insulating layer (the first cover insulating layer) 6, the second conductive pattern 30, the second cover insulating layer 31, the third conductive pattern 70, and the third cover insulating layer 71. Preferably, in the fourth embodiment, the mounting board 1 consists of only the base insulating layer 4, the conductive pattern 5, the cover insulating layer 6, the second conductive pattern 30, and the second cover insulating layer 31, the third conductive pattern 70, and the third cover insulating layer 71.

The third conductive pattern 70 is provided at the upper side of the second cover insulating layer 31 so as to be in contact with the upper surface of the second cover insulating layer 31. The third conductive pattern 70 includes a plurality of third imaging element connecting terminals (not shown), a plurality of third external component connecting terminals (not shown), and a plurality of third metal wires 72.

The plurality of third imaging element connecting terminals are formed so as to be exposed from a third connecting element connecting terminal opening portion (not shown) that is formed in the base insulating layer 4.

The plurality of third external component connecting terminals are formed so as to be exposed from the third external component connecting terminal opening portion (not shown) that is formed in the base insulating layer 4.

The plurality of third metal wires 72 include a plurality of third connecting wires 73 and a plurality of third ground wires 74. The plurality of third connecting wires 73 are provided corresponding to the plurality of third imaging element connecting terminals and the plurality of third external component connecting terminals so as to connect them. The plurality of third ground wires 74 are provided so as to correspond to the plurality of third connecting wires 73.

The material, the elastic modulus, and the thermal expansion coefficient of the third conductive pattern 70 are the same as the material, the elastic modulus, and the thermal expansion coefficient of the conductive pattern 5, respectively.

A thickness $T_7$ of the third conductive pattern 70 and the width of the third metal wire 72 are the same as the thickness $T_2$ of the conductive pattern 5 and the width of the metal wire 9, respectively.

The third cover insulating layer 71 is provided at the upper side of the second cover insulating layer 31 and the third conductive pattern 70 so as to cover the third conductive pattern 70. The outer shape of the third cover insulating layer 71 is formed so as to be the same as the base insulating layer 4.

The material, the elastic modulus, the thermal expansion coefficient, and a thickness $T_8$ of the third cover insulating layer 71 are the same as the material, the elastic modulus, the thermal expansion coefficient, and the thickness $T_3$ of the cover insulating layer 6, respectively.

When the mounting board 1 is projected in the thickness direction, a region in which at least one of the metal wire 9, the second metal wire 32, and the third metal wire 72 is present when viewed from the top or the bottom is defined as the wire region 16 (excluding a terminal region in which terminals such as the imaging element connecting terminal 10, the second imaging element connecting terminal, and the third imaging element connecting terminals are present when projected in the thickness direction).

The equivalent elastic modulus D of the fourth embodiment is the same as the equivalent elastic modulus D of the first embodiment, and is 5 GPa or more and 55 GPa or less. The equivalent elastic modulus D of the fourth embodiment is preferably 10 GPa or more, and preferably 50 GPa or less. In a wire region (enlarged view of FIG. 12) in which the base insulating layer 4, the conductive pattern 5 (the metal wire 9), the cover insulating layer 6, the second conductive pattern 30 (the second metal wire 32), the second cover insulating layer 31, the third conductive pattern 70 (the third metal wire 72), and the third cover insulating layer 71 are laminated, the equivalent elastic modulus D of the fourth embodiment is shown by the following formula.

$$D=\{D_1\times T_1+D_2\times T_2+D_3\times T_3+D_4\times T_4+D_5\times T_5+D_7\times T_7+D_8\times T_8\}/\{T_1+T_2+T_3+T_4+T_5+T_7+T_8\}$$

$D_7$ shows the elastic modulus of the third metal wire 72, and $T_7$ shows the thickness of the third metal wire 72.

$D_8$ shows the elastic modulus of the third cover insulating layer 71, and $T_8$ shows the thickness of the third cover insulating layer 71.

In the wire region 16, a ratio of the total thickness of the metal with respect to the total thickness of the insulating layer, that is, a ratio $(T_2+T_4+T_7/(T_1+T_3+T_5+T_8))$ of the total thickness of the metal wire 9, the second metal wire 32, and the third metal wire 72 with respect to the total thickness of the base insulating layer 4, the cover insulating layer 6, the second cover insulating layer 31, and the third cover insulating layer 71 is, for example, 0.05 or more, preferably 0.10 or more, more preferably 0.20 or more, and for example, 0.90 or less, preferably 0.70 or less.

The total thickness (the total thickness of the metal wire 9, the second metal wire 32, and the third metal wire 72) of the metal is the same as the total thickness of the first embodiment.

After the mounting board 1 of the second embodiment is obtained in a state of being supported by the metal supporting plate 19, the third conductive pattern 70 and the third cover insulating layer 71 are formed on the upper surface of the second cover insulating layer 6 in this order, and subsequently, the metal supporting plate 19 is removed, so that the mounting board 1 of the fourth embodiment can be produced.

In the fourth embodiment, the same function and effect as that of the first embodiment can be achieved. Also, in the fourth embodiment, the same modified example as that of the first embodiment can be applied. Also, in the fourth embodiment, the metal shield layer 40 of the third embodiment can be provided instead of the third conductive pattern 70.

In the embodiment shown in FIG. 12, a wire region in which all of the seven layers (the base insulating layer 4, the metal wire 9, the cover insulating layer 6, the second metal wire 32, the second cover insulating layer 31, the third metal wire 72, and the third cover insulating layer 71) are disposed so as to be overlapped in the up-down direction is present. Alternatively, for example, though not shown, the above-described wire region may not be present. To be specific, the metal wire 9, the second metal wire 32, and the third metal wire 72 are not overlapped in the same region in the up-down direction, and the two wires of these wires (9, 32, 72) are overlapped. In this case, the equivalent elastic modulus D, a ratio of the total thickness of the metal, or the like are calculated in the wire region by using the elastic modulus and the thickness of the overlapped layers only.

EXAMPLES

Next, the present invention is further described based on Examples and Comparative Examples. The present invention is however not limited by these Examples and Comparative Examples. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

(Examples by Simulation)

Example 1

A mounting board sequentially including a polyimide layer having a length of 8 mm, a width of 8 mm, and a thickness of 10 μm as a base insulating layer, a copper layer having a thickness of 8 μm that is disposed on the entire surface of the polyimide layer as a conductive pattern, and a polyimide layer having a thickness of 5 μm that is disposed on the entire surface of the copper layer as a cover insulating layer was supposed. The elastic modulus of the polyimide was 6.3 GPa, and the linear thermal expansion coefficient was 17 ppm/K. The elastic modulus of the copper was 123 GPa, and the linear thermal expansion coefficient was 17 ppm/K.

Examples 2 to 6

A mounting board was supposed in the same manner as that of Example 1, except that the thickness of each of the layers (the base insulating layer, the conductive pattern, the cover insulating layer) was changed to that shown in Table 1.

Example 7

A mounting board including a polyimide layer having a length of 8 mm, a width of 8 mm, and a thickness of 3 μm as a base insulating layer, a copper layer having a thickness of 3 μm that is disposed on the entire surface of the polyimide layer as a first conductive pattern, a polyimide layer having a thickness of 5 μm that is disposed on the entire surface of the copper layer as a first cover insulating layer, a copper layer having a thickness of 3 μm that is disposed on the entire surface of the polyimide layer as a second conductive pattern, and a polyimide layer having a thickness of 3 μm that is disposed on the entire surface of the copper layer as a second cover insulating layer was supposed.

Example 8

A mounting board including a polyimide layer having a length of 8 mm, a width of 8 mm, and a thickness of 5 μm as a base insulating layer, a copper layer having a thickness of 3 μm that is disposed on the entire surface of the polyimide layer as a first conductive pattern, a polyimide layer having a thickness of 3 μm that is disposed on the entire surface of the copper layer as a first cover insulating layer, a copper layer having a thickness of 0.1 μm that is disposed on the entire surface of the polyimide layer as a metal shield layer, and a polyimide layer having a thickness of 3 μm that is disposed on the entire surface of the copper layer as a second cover insulating layer was supposed.

Example 9

A mounting board including a polyimide layer having a length of 8 mm, a width of 8 mm, and a thickness of 5 μm as a base insulating layer, a copper layer having a thickness of 3 μm that is disposed on the entire surface of the polyimide layer as a first conductive pattern, a polyimide layer having a thickness of 3 μm that is disposed on the entire surface of the copper layer as a first cover insulating layer, a copper layer having a thickness of 3 μm that is disposed on the entire surface of the polyimide layer as a second conductive pattern, a polyimide layer having a thickness of 3 μm that is disposed on the entire surface of the copper layer as a second cover insulating layer, a copper layer having a thickness of 3 μm that is disposed on the entire surface of the polyimide layer as a third conductive pattern, and a polyimide layer having a thickness of 3 μm that is disposed on the entire surface of the copper layer as a third cover insulating layer was supposed.

Example 10

A mounting board was supposed in the same manner as that of Example 9, except that the thickness of the third conductive pattern was changed to that shown in Table 1.

Comparative Example 1

A mounting board was supposed in the same manner as that of Example 1, except that the thickness of each of the layers was changed to that shown in Table 1.

Comparative Example 2

A mounting board was supposed in the same manner as that of Example 7, except that the thickness of each of the layers was changed to that shown in Table 1.

(Evaluation)

A CMOS sensor (elastic modulus of 131 GPa, linear thermal expansion coefficient of 2.8 ppm/K) having a length of 6 mm, a width of 6 mm, and a thickness of 100 μm was prepared. The warping in a heat cycle with a difference in temperature of 65° C. of a measurement sample in which the CMOS sensor was laminated on each of the mounting boards of Examples and Comparative Examples was calculated.

In the calculation of the warping a calculation formula of the warping W shown in a document of "S. Timoshenko, "Analysis of Bi-Metal Thermostats", J optical soc., p 233 to 235, 1925" was used. The results are shown in Table 1.

TABLE 1

|  | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 | Comp. Ex. 2 |
|---|---|---|---|---|---|---|---|---|---|---|---|---|
| Third Cover Insulating Layer T8 (μm) | — | — | — | — | — | — | — | — | 3 | 3 | — | — |
| Third Conductive Pattern T7 (μm) | — | — | — | — | — | — | — | — | 3 | 0.1 | — | — |
| Second Cover insulating Layer T5 (μm) | — | — | — | — | — | — | 3 | 3 | 3 | 3 | — | 5 |
| Shield Layer T6 (μm) | — | — | — | — | — | — | — | 0.1 | — | — | — | — |
| Second Conductive Pattern T4 (μm) | — | — | — | — | — | — | 3 | — | 3 | 3 | — | 12 |
| Cover Insulating Layer T3 (μm) | 5 | 18 | 3 | 5 | 3 | 3 | 5 | 3 | 3 | 3 | 5 | 12 |
| Conductive Pattern T2 (μm) | 10 | 8 | 1 | 8 | 5 | 3 | 3 | 3 | 3 | 3 | 25 | 12 |
| Base Insulating Layer T1 (μm) | 10 | 18 | 5 | 10 | 5 | 5 | 3 | 5 | 5 | 5 | 10 | 5 |

TABLE 1-continued

|  | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 | Comp. Ex. 2 |
|---|---|---|---|---|---|---|---|---|---|---|---|---|
| Total Thickness of Wire Region (μm) | 25 | 44 | 9 | 23 | 13 | 11 | 17 | 14.1 | 23 | 20.1 | 40 | 46 |
| Ratio of Thickness of Copper to Insulating Layer | 0.67 | 0.22 | 0.13 | 0.53 | 0.63 | 0.38 | 0.55 | 0.28 | 0.64 | 0.44 | 1.67 | 1.09 |
| Equivalent Elastic Modulus (GPa) | 53 | 28 | 19 | 47 | 51 | 38 | 47 | 32 | 52 | 49 | 79 | 67 |
| Warping (μm) | 21 | 20 | 4 | 18 | 12 | 8 | 14 | 9 | 19 | 15 | 32 | 32 |

The result of Table 1 shows that the warping of the mounting board is small in a case of the equivalent elastic modulus of 5 GPa or more and 55 GPa or less. Accordingly, when the equivalent elastic modulus of the wire region is 5 GPa or more and 55 GPa or less, it is shown that the warping of the wire region can be reduced, so that the warping of the entire mounting board can be reduced.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The imaging element mounting board, the method for producing an imaging element mounting board, and the mounting board assembly of the present invention can be used in various industrial products, and for example, can be preferably used for imaging devices such as camera module.

DESCRIPTION OF REFERENCE NUMERALS

1 Mounting board
4 Base insulating layer
5 Conductive pattern
6 Cover insulating layer
9 Metal wire
14 Connecting wire
15 Ground wire
16 Wire region
19 Metal supporting plate
21 Imaging element
31 Second cover insulating layer
40 Metal shield layer
43 Inclined portion
50 Mounting board assembly
60 Pressure-sensitive adhesive layer
61 Supporting body

The invention claimed is:

1. An imaging element mounting board for mounting an imaging element, comprising:
a wire region including:
a first insulating layer having an imaging element opening portion,
a metal wire disposed at one side in a thickness direction of the first insulating layer, and
a second insulating layer disposed at one side in the thickness direction of the metal wire,
wherein an equivalent elastic modulus of the wire region is 5 GPa or more and 55 GPa or less,
wherein a difference of thermal expansion coefficients between the metal wire and the first insulating layer is 10 ppm/K or less,
wherein a difference of thermal expansion coefficients between the metal wire and the second insulating layer is 10 ppm/K or less,
wherein the imaging element mounting board includes a conductive pattern having an imaging element connecting terminal and the metal wire,
wherein the imaging element connecting terminal integrally includes an outer peripheral portion that is disposed at an outer periphery of the imaging element opening portion and an inner side portion that is disposed at an inside of the imaging element opening portion so as to be recessed from the outer peripheral portion inwardly, and
wherein an exposed surface of the inner side portion is exposed from the imaging element opening portion at the other side in the thickness direction of the first insulating layer.

2. The imaging element mounting board according to claim 1, wherein the metal wire has a thickness of 1 μm or more and 8 μm or less.

3. The imaging element mounting board according to claim 1, wherein the imaging element mounting board has a total thickness of 40 μm or less.

4. The imaging element mounting board according to claim 1, wherein
the wire region further includes a metal shield layer disposed at one side in the thickness direction of the second insulating layer, and a third insulating layer disposed at one side in the thickness direction of the metal shield layer.

5. The imaging element mounting board according to claim 4, wherein
the metal wire includes a ground wire, and
the metal shield layer is electrically connected to the ground wire.

6. The imaging element mounting board according to claim 5, wherein
the metal shield layer includes an inclined portion extending in an inclination direction that inclines with respect to the thickness direction, and being in contact with the ground wire.

7. The imaging element mounting board according to claim 1, wherein
in the wire region, a ratio of a total thickness of the metal wire with respect to a total thickness of the first insulating layer and the second insulating layer is 0.10 or more and 0.70 or less.

8. The imaging element mounting board according to claim 7, wherein
in the wire region, a ratio of a total thickness of the metal wire with respect to a total thickness of the first insulating layer and the second insulating layer is 0.20 or more and 0.70 or less.

9. The imaging element mounting board according to claim 1, further comprising:
a supporting body and a pressure-sensitive adhesive layer.

10. A mounting board assembly comprising:
the plurality of imaging element mounting boards according to claim 1.

11. The mounting board assembly according to claim 10, wound into a roll shape.

12. A method for producing the imaging element mounting board according to claim 1, comprising the steps of:
preparing a metal supporting plate, forming a first insulating layer at one side in a thickness direction of the metal supporting plate,
forming a metal wire at one side in the thickness direction of the first insulating layer,
forming a second insulating layer at one side in the thickness direction of the metal wire, and
removing the metal supporting plate.

13. The method for producing an imaging element mounting board according to claim 12, further comprising:
after the step of forming the second insulating layer and before the step of removing the metal supporting plate,
a step of forming a metal shield layer at one side in the thickness direction of the second insulating layer and
a step of forming a third insulating layer at one side in the thickness direction of the metal shield layer.

14. The imaging element mounting board according to claim 1, wherein a warping of the imaging element mounting board is 21 μm or less.

* * * * *